(12) United States Patent
Lee

(10) Patent No.: US 7,535,780 B2
(45) Date of Patent: May 19, 2009

(54) SEMICONDUCTOR MEMORY DEVICE AND REDUNDANCY METHOD OF THE SAME

(75) Inventor: Yun-Sang Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 237 days.

(21) Appl. No.: 11/723,473

(22) Filed: Mar. 20, 2007

(65) Prior Publication Data
US 2008/0126876 A1 May 29, 2008

(30) Foreign Application Priority Data
Nov. 23, 2006 (KR) .................. 10-2006-0116327

(51) Int. Cl.
*G11C 29/00* (2006.01)
(52) U.S. Cl. .............. 365/200; 365/230.06; 365/189.07
(58) Field of Classification Search ................ 365/200, 365/230.06, 189.07
See application file for complete search history.

(56) References Cited

U.S. PATENT DOCUMENTS

| | | | | |
|---|---|---|---|---|
| 5,548,557 | A | * 8/1996 | Futatsuya et al. | ........... 365/201 |
| 5,602,778 | A | * 2/1997 | Futatsuya et al. | ...... 365/185.09 |
| 5,787,043 | A | * 7/1998 | Akioka et al. | ............... 365/200 |
| 6,256,237 | B1 | 7/2001 | Ho et al. | |
| 6,667,915 | B2 | * 12/2003 | Yonezu et al. | .............. 365/200 |
| 6,940,765 | B2 | * 9/2005 | Kyung | ......................... 365/200 |
| 7,359,263 | B2 | * 4/2008 | Ogawa | ....................... 365/200 |

FOREIGN PATENT DOCUMENTS

| | | |
|---|---|---|
| JP | 63-117400 | 5/1988 |
| JP | 04-149899 | 5/1992 |
| KR | 10-181204 | 12/1998 |
| KR | 2003-0066074 | 5/2002 |
| KR | 2002-0040116 | 8/2003 |

OTHER PUBLICATIONS

Yun-Sang Lee et al., "An efficient self post package repair algorithm and implementation in memory system with on-chip-ECU" 2006 IEEE Asian Solid-State Circuits Conference. pp. 331-334, Nov. 13-15, 2006.
Decision of Grant dated Oct. 7, 2008 for corresponding Korean Application No. 10-2006-0116327.

* cited by examiner

*Primary Examiner*—Tuan T. Nguyen
(74) *Attorney, Agent, or Firm*—Harness, Dickey & Pierce, P.L.C.

(57) ABSTRACT

A semiconductor memory device may include a memory cell array, a redundancy address decoder, a defective address detection unit, and a defective address program unit. The memory cell array includes a plurality of memory cell groups and a predetermined number of redundancy memory cell groups. The redundancy address decoder includes a predetermined number of redundancy decoders for accessing at least one group of the redundancy memory cell groups when a first defective address is identical to an externally applied address. The defective address detection unit performs a write operation and a read operation on the memory cell array during a test operation to detect a defective address, and outputs the detected defective address as the first defective address when the same defective address is detected a predetermined number of times or more. The defective address program unit receives and programs the first defective address output from the defective address detection unit during a program operation.

43 Claims, 17 Drawing Sheets

SEMICONDUCTOR MEMORY DEVICE AND REDUNDANCY METHOD OF THE SAME

PRIORITY STATEMENT

This application claims the benefit of priority to Korean Patent Application No. 10-2006-0116327, filed Nov. 23, 2006, the entire contents of which are hereby incorporated herein by reference in their entirety.

BACKGROUND

1. Field

Example embodiments relate to a semiconductor memory device and, for example, to a semiconductor memory device configured to repair failures in memory cells caused after a packaging process, and/or a redundancy method of the same.

2. Description of Related Art

A conventional semiconductor memory device may perform a primary test on memory cells at a wafer level and program a defective address into a redundancy circuit included therein if a defective memory cell is detected. If the defective address is applied in a normal operation of the semiconductor memory device, the defective memory cell may be replaced with a redundancy memory cell. Accordingly, a defective semiconductor memory device may be repaired and/or determined to be non-defective.

A semiconductor memory device, which is determined to be non-defective at a wafer level, may be packaged through a packaging process. The packaged semiconductor memory device may perform the test on the memory cells at a package level. If a defective memory cell is found at the package level the semiconductor memory device may be finally decided as a defective semiconductor memory device.

In many cases, only one or two memory cells of the semiconductor memory device are defective at a package level. Accordingly, many attempts at repairing the defective memory cells have been made and many related techniques have been disclosed.

However, in many conventional semiconductor memory devices, after a test is performed at a package level under the control of a test apparatus, an address of a defective memory cell may be stored in the test apparatus. The address of the defective memory cell may be applied by the test apparatus to the semiconductor memory device in a repair operation so that the address of the defective memory cell may be programmed. Accordingly, the semiconductor memory device that is decided as a defective device at the package level may be repaired and/or determined to be non-defective.

In other words, in many of the conventional semiconductor memory devices, after the address of the memory cell that is defective at the package level is stored in the test apparatus, the address of the defective memory cell needs to be applied by the test apparatus to the semiconductor memory device and programmed.

SUMMARY

An example embodiment may provide a semiconductor memory device configured to repair a failure in a memory cell detected at a package level.

Another example embodiment may provide a semiconductor memory device configured to program an address of a defective memory cell after storing the address of the defective memory cell therein.

Another example embodiment may provide a redundancy method of the semiconductor memory device in order to achieve the above objects.

In one aspect, the present invention is directed to a semiconductor memory device comprising: a memory cell array, which includes a plurality of memory cell groups and a predetermined number of redundancy memory cell groups; a redundancy address decoder, which includes a predetermined number of redundancy decoders for accessing at least one group of the redundancy memory cell groups when a first defective address is identical to an address; a defective address detection unit, which performs a write operation and a read operation on the memory cell array during a test operation to detect a defective address and outputs the detected defective address as the first defective address when the same defective address is detected a predetermined number of times or more; and a defective address program unit, which receives the first defective address output from the defective address detection unit and programs the first defective address during a program operation.

The semiconductor memory device may further comprise a redundancy control unit, which receives a predetermined number of redundancy signals output from the redundancy decoders, and outputs the programmed first defective address to an unused redundancy decoder of the redundancy decoders in response to the redundancy signals. Also, the semiconductor memory device may further comprise an address decoder, which accesses at least one group of the memory cell groups in response to an externally applied address, and a mode setting unit, which generates a test enable signal for the test operation and a program enable signal for the program operation in response to an externally applied signal during a mode setting operation.

Each of the redundancy decoders may generate the redundancy signal when a second defective address is programmed at a wafer level, and access at least another one of the redundancy memory cell groups when the programmed second defective address is identical to an externally applied address.

The redundancy address decoder may generate an enable signal when the address is identical to one of the first and second defective addresses, and the address decoder may be disabled in response to the enable signal.

The defective address detection unit may comprise a data input and error code generation portion, an error detection and correction portion, and a defective address generation portion. The data input and error code generation portion may receive externally applied input data to generate an error code corresponding to the input data during the write operation, and output the input data and the error code to the memory cell array. The error detection and correction portion may receive read data from the memory cell array during the read operation, and detect whether there is an error in data included in the read data to generate an error signal. Also, the defective address generation portion may be enabled in response to the test enable signal, store the address in response to the error signal, and output the address as the first defective address when the error signal is generated in the same address a predetermined number of times or more. The defective address generation portion may comprise a first switch, an address input controller, a second switch, a selector, and a predetermined number of error classification and storage portions. The first switch may output the address in response to the error signal. The address input controller may generate an address input control signal in response to an address non-identity signal. The second switch may output the address in response to the address input control signal. The selector may enable one of a predetermined number of selection signals in response to the address input control signal. Each of the error classification and storage portions may comprise an address storage portion, a comparison and signal generator, a third switch, a switch controller, and a fourth switch. The address storage portion may store a temporary defective address. The comparison and signal generator may generate an address identity signal when an address transmitted from the first switch is identical to the temporary defective address, and generate the address non-identity signal when the address transmitted form the first switch is not identical to the temporary defective address. The third switch may output the temporary defective address as the first defective address when the address identity signal is generated the predetermined number of times or more. The switching controller may generate a switching control signal in response to the selection signal. The fourth switch may output an address output from the second switch as the temporary defective address in response to the switching control signal. The error detection and correction portion may comprise an error detector and an error corrector. The error detector may generate an error code corresponding to the data included in the read data, and generate the error signal when the error code is not identical to an error code included in the read data. The error corrector may correct the error in the data included in the read data in response to the error signal to generate output data.

The defective address program unit may comprise a program control portion, a predetermined number of program portions, and a program end detection portion. The program control portion may be enabled in response to the program enable signal to generate a program clock signal, and disabled in response to a program end signal. The program portions may program the first defective address in response to the program clock signal and a high voltage. The program end detection portion may generate the program end signal when the programmed first defective address is identical to the first defective address. The program control portion may comprise a clock generator and a program clock signal generator. The clock generator may generate a first clock signal in response to the program enable signal, and may be disabled in response to the program end signal. The program clock signal generator may generate a plurality of program clock signals, which are enabled in sequence, in response to the first clock signal, and may be disabled in response to the program end signal. The program clock signal generator may comprise a shift register and a combinational circuit. The shift register may comprise a plurality of flip-flops that are connected in series and shift a high-level signal in response to the first clock signal. The shifting register may generate a shifting end signal, and reset the flip-flops in response to one of the shifting end signal and the program end signal. The combinational circuit may generate output signals of the flip-flops as the program clock signals in response to the shifting end signal.

Each of the program portions may comprise a plurality of program circuits, each of which has a fuse capable of being electrically cut. When the high voltage is applied to the program portions, the program portions simultaneously program at least 1 bit of the first defective address, which is applied to each of the program portions, in response to each of the program clock signals. Each of the program circuits may comprise: a logic AND gate for outputting 1 bit of the first defective address in response to the program clock signal; a first fuse having one side connected to a power supply voltage terminal; a second fuse having one side connected to the power supply voltage terminal; a first switching transistor having a drain connected to the other side of the first fuse, a gate to which an output signal of the logic AND gate is applied, and a source connected to a ground voltage; a first PMOS transistor having a source connected to the other side of the first fuse, a gate connected to a first node, and a drain connected to a second node; a second PMOS transistor having a source connected to the other side of the second fuse, a gate connected to the second node, and a drain connected to the first node; a first NMOS transistor having a drain connected to the drain of the first PMOS transistor, a gate connected to the second node, and a source connected to the ground voltage; and a second NMOS transistor having a drain connected to the first node, a gate connected to the second node, and a source connected to the ground voltage. Each of the program circuits may output 1 bit of the programmed first defective address through the second node, and the high voltage may be applied to the power supply voltage terminal during the program operation.

The redundancy control unit may further comprise a switching portion, which sequentially outputs the programmed first defective address in response to each of a predetermined number of switching clock signals. Also, the redundancy control unit may further comprise a clock signal generation portion, which generates a clock signal and sequentially generates the switching clock signals in response to the clock signal. Further, the redundancy control unit may comprise a predetermined number of redundancy control circuits that are cascade-connected. In this case, the predetermined number of redundancy control circuits may comprise a decoder and a switching control signal generation portion. The decoder may receive a front-end redundancy signal and the corresponding redundancy signals, enable a first decoding signal when both the front-end redundancy signal and the corresponding redundancy signal indicate the use of redundancy, enable a second decoding signal when the front-end redundancy signal indicates the use of redundancy and the corresponding redundancy signal indicates the disuse of redundancy, enable a third decoding signal when the front-end redundancy signal indicates the disuse of redundancy and the corresponding redundancy signal indicates the use of redundancy, and enable a fourth decoding signal when both the front-end redundancy signal and the corresponding redundancy signal indicate the disuse of redundancy. The switching control signal generation portion may generate the first decoding signal as a first output signal when a first output signal of the front-end redundancy control circuit is disabled, generate the second decoding signal as a second output signal when the first output signal of the front-end redundancy control circuit is enabled, generate the third decoding signal as the first output signal when a switching control signal of the front-end redundancy control circuit is disabled, generate the fourth decoding signal as the second output signal when the switching control signal of the front-end redundancy control circuit is enabled, and output the second output signal as the switching control signal in response to a clock signal. The redundancy control unit may comprise a predetermined number of redundancy control circuits that are cascade-connected. In this case, each of the redundancy control circuits may comprise: a decoder for receiving a front-end redundancy signal and the corresponding redundancy signal to generate a first through fourth decoding signals; a first switch for generating the first decoding signal as a first output signal or generating the second decoding signal as a second output signal in response to a first output signal output from the front-end redundancy control circuit; a second switch for generating the third decoding signal as the first output signal or generating the fourth decoding signal as the second output signal in response to a switching control signal output from the front-end redundancy control circuit; and a first flip-flop for outputting the second output signal as the corresponding switching control signal in response to a clock signal. A first redundancy control circuit of the redundancy control circuits that are cascade-connected may comprise a third switch and a second flip-flop. The third switch may generate a power supply voltage as a first output signal or generate a second output signal in response to a first redundancy signal. The second flip-flop may output the second output signal as a first switching control signal in response to the clock signal.

The redundancy control unit may further comprise a predetermined number of fourth switches for transmitting the programmed first defective address in response to the switching control signals output from the redundancy control circuits. Each of the redundancy decoders may be included in each of the redundancy memory cell groups, and may comprise: a redundancy signal generation portion including a first fuse and for generating the redundancy signal depending on the cutting of the first fuse when a reset signal is applied; a first decoder including a plurality of second fuses, and for programming the second defective address depending on the cutting of the second fuses and generating a selection signal for selecting the corresponding redundancy memory cell group in response to the redundancy signal when the programmed second defective address is identical to the address; a redundancy control signal generation portion for detecting the application of the first defective address from the corresponding one of the fourth switches to generate a redundancy control signal; and a second decoder being enabled in response to the redundancy control signal, and for generating a selection signal for selecting the corresponding redundancy memory cell group when the programmed first defective address is identical to the address.

The reset signal may be a signal that transitions from a low level to a high level during an initialization operation and transitions from a high level to a low level in a predetermined amount of time. The redundancy signal generation portion may comprise: a first PMOS transistor having a source to which a power supply voltage is applied and a gate to which the reset signal is applied; a first NMOS transistor having a source to which a ground voltage is applied, a gate to which the reset signal is applied, and a drain connected to a first node; a first inverter for inverting a signal at the first node to output the redundancy signal to a second node; and a second NMOS transistor having a source to which the ground voltage is applied, a gate to which the redundancy signal is applied, and a drain connected to the first node, the first fuse being connected between a drain of the first PMOS transistor and the drain of the first NMOS transistor. The first decoder may comprise a plurality of fuse program circuits, which comprise the second fuses, respectively. Each of the fuse program circuits may comprise: a first NMOS transistor having a gate to which the redundancy signal is applied and a drain (or a source) to which 1 bit corresponding to the address is applied; the second fuse having one side connected to the source (or the drain) of the first NMOS transistor; and a second NMOS transistor having a gate to which an inverted signal of the redundancy signal is applied, a drain connected to the other side of the second fuse, and a source to which the ground voltage is applied, an output signal being output through the drain of the second NMOS transistor. The redundancy control signal generation portion may comprise a logic OR gate for performing a logic OR operation on a 1-bit signal of the programmed first defective address output from the corresponding fourth switch among the fourth switches and an inverted signal of the 1-bit signal to generate the redundancy control signal. The second decoder may comprise circuits corresponding to the respective bits of the address, and each of the circuits of the second decoder may comprise: a first NMOS transistor having a drain (or a source) to which the corresponding bit of the address is applied and a gate to which the redundancy control signal is applied; a second NMOS transistor having a drain connected to the source (or the drain) of the first NMOS transistor and a gate to which the corresponding bit of the first defective address is applied; and a third NMOS transistor having a drain connected to a source of the second NMOS transistor, a gate to which an inverted signal of the redundancy control signal is applied, and a source to which a ground voltage is applied, an output signal being output through the drain of the third NMOS transistor.

In another aspect, the present invention is directed to a redundancy method of a semiconductor memory device comprising a memory cell array including a plurality of memory cell groups and a predetermined number of redundancy memory cell groups. The method comprises: performing a write operation and a read operation on the memory cell array during a test operation to detect a defective address, and outputting the detected defective address when the same defective address is detected a predetermined number of times or more; receiving and programming the detected defective address during a program operation to generate the programmed defective address; and accessing the redundancy memory cell group in a normal operation when the programmed defective address is identical to an externally applied address.

Detecting the defective address may comprise: receiving externally applied input data and generating an error code corresponding to the input data during the write operation, and outputting the input data and the error code to the memory cell array; receiving read data from the memory cell array during the read operation and detecting whether there is an error in data included in the read data to generate an error signal; and storing the address in response to the error signal, and outputting the address as the defective address when the error signal is generated in the same address a predetermined number of times or more.

Programming the defective address may comprise: programming at least 1 bit of the defective address; and ending the programming of the defective address when the programmed defective address is identical to the detected defective address, and re-programming the defective address when the programmed defective address is different from the detected defective address.

The semiconductor memory device may further comprise a predetermined number of redundancy decoders for accessing the redundancy memory cell groups. Accessing the redundancy memory cell group may comprise outputting the programmed defective address to an unused redundancy decoder of the redundancy decoders in response to a predetermined number of redundancy signals output from the redundancy decoders.

The semiconductor memory device may further comprise a predetermined number of redundancy control circuits that are cascade-connected. Outputting the programmed defective address to the unused redundancy decoder may comprise: receiving an adjacent redundancy signal and the corresponding redundancy signal to enable a first decoding signal when both the adjacent redundancy signal and the corresponding redundancy signal indicate the use of redundancy, enable a second decoding signal when the adjacent redundancy signal indicates the use of redundancy and the corresponding redundancy signal indicates the disuse of redundancy, enable a third decoding signal when the adjacent redundancy signal indicates the disuse of redundancy and the corresponding redundancy signal indicates the use of redundancy, and enable a fourth decoding signal when both the adjacent redundancy signal and the corresponding redundancy signal indicate the disuse of redundancy; and generating the first decoding signal as a first output signal when a first output signal of a front-end redundancy control circuit is disabled, generating the second decoding signal as a second output signal when the first output signal of the front-end redundancy control circuit is enabled, generating the third decoding signal as the first output signal when a switching control signal of the front-end redundancy control circuit is disabled, generating the fourth decoding signal as the second output signal when the switching control signal of the front-end redundancy control circuit is enabled, and outputting the second output signal as the switching control signal in response to a clock signal.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
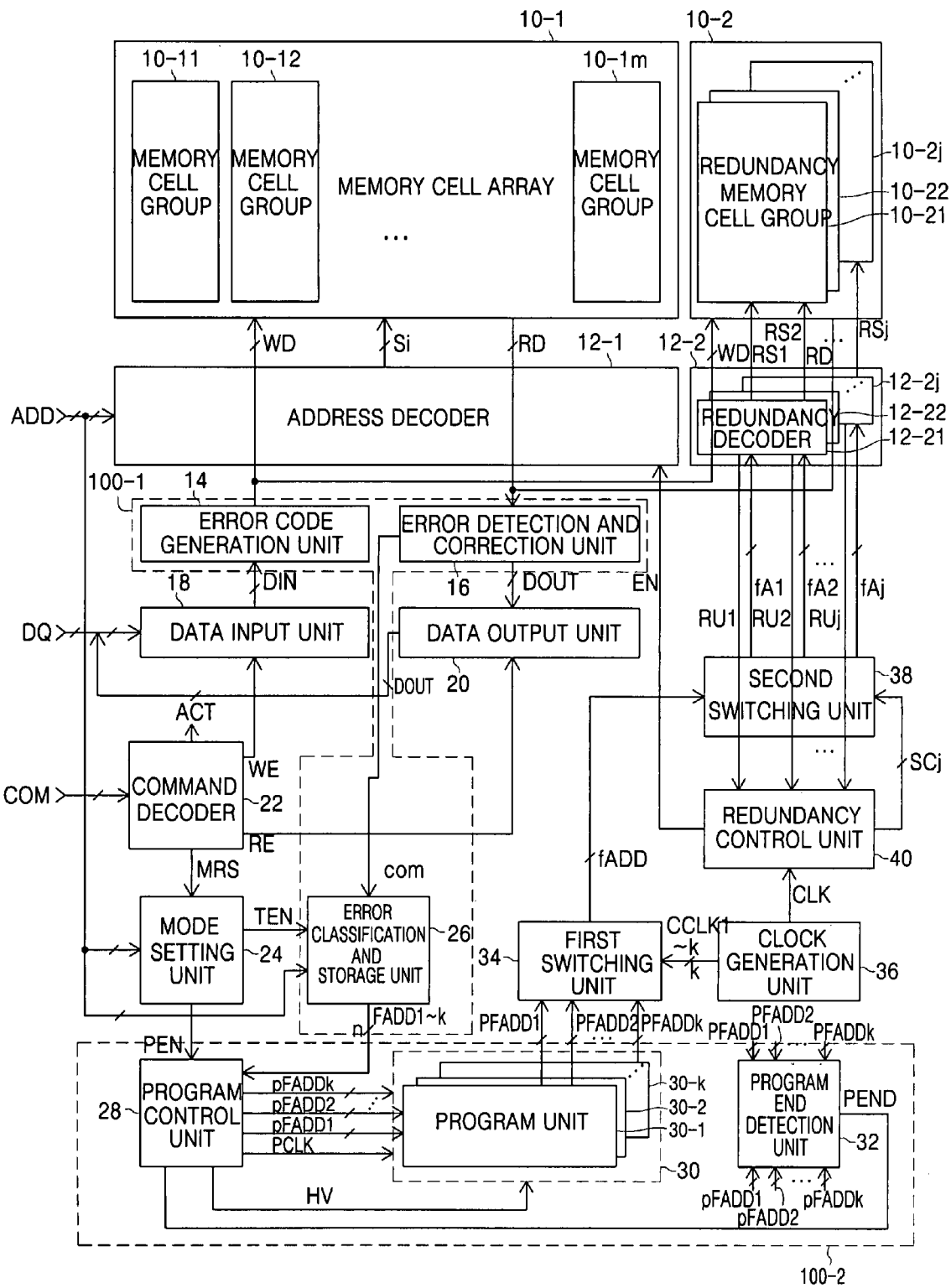
FIG. 1 is a block diagram of a semiconductor memory device according to an example embodiment.

Example embodiments will now be described more fully hereinafter with reference to the accompanying drawings. Embodiments may, however, be embodied in many different forms and should not be construed as limited to the example embodiments set forth herein. Rather, these example embodiments are provided so that this disclosure is thorough and complete and fully conveys the scope to those skilled in the art. In the drawings, the thicknesses of layers and regions are exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 is a block diagram of a semiconductor memory device according to an example embodiment.

Referring to FIG. 1, the semiconductor memory device may include a memory cell array 10-1, a redundancy memory cell array 10-2, an address decoder 12-1, a redundancy address decoder 12-2, an error code generation unit 14, an error detection and correction unit 16, a data input unit 18, a data output unit 20, a command decoder 22, a mode setting unit 24, an error classification and storage unit 26, a program control unit 28, a program unit 30, a program end detection unit 32, a first switching unit 34, a clock generation unit 36, a second switching unit 38, and/or a redundancy control unit 40.

Functions of the blocks shown in FIG. 1 will now be described as follows.

The address decoder 12-1 may be enabled in response to an enable signal EN from the redundancy control unit 40 and/or decode an externally applied address ADD to generate selection signals Si (for example, i may be an integer greater than 0) for selecting one of word lines or column selection signal lines of the memory cell array 10-1. The redundancy address decoder 12-2 may include "j" number of redundancy decoders 12-21 to 12-2j (for example, j may be an integer less than i), which may generate redundancy selection signals RS1 to RSj for selecting one of redundancy word lines or redundancy column selection signal lines of the redundancy memory cell array 10-2 if the externally applied address ADD is identical to a programmed defective address. The redundancy decoders 12-21 to 12-2j may program defective addresses found at a wafer level. The redundancy decoders 12-21 to 12-2j, which may not be used at the wafer level, may program defective addresses fA1 to fAj at a package level. The address decoder 12-1 may be a row address decoder, which may decode an externally applied row address ADD in response to an active command ACT and select one of the word lines. The address decoder 12-1 may be a column address decoder, which may decode an externally applied column address ADD in response to a write command WE or a read command RE and select one of the column selection signal lines. Similarly, the redundancy address decoder 12-2 may enable one of the redundancy selection signals RS1 to RSj if the row address ADD that is externally applied in response to the active command ACT is identical to one of the programmed defective addresses, and/or may enable one of the redundancy column selection signals RS1 to RSj if the column address ADD that is externally applied in response to the write command WE or the read command RE is identical to one of the programmed defective column addresses.

The memory cell array 10-1 may include memory cell groups 10-11 to 10-1m. The memory cell array 10-1 may store write data WD including data and/or error correction codes in a memory cell group selected from memory cells 10-11 to 10-1m in response to a selection signal Si during a write operation and/or output read data RD including data and/or error correction codes from a memory cell group selected from memory cells 10-11 to 10-1m in response to the selection signal Si during a read operation. The redundancy memory cell array 10-2 may include redundancy memory cell groups 10-21 to 10-2j. The redundancy memory cell array 10-2 may store write data WD in a redundancy memory cell group selected from redundancy memory cells 10-21 to 10-2j in response to the redundancy selection signal RSj during a write operation and/or output read data RD from a redundancy memory cell group selected from redundancy memory cells 10-21 to 10-2j in response to the selection signal RSj during a read operation. Accordingly, a memory cell group connected to a selected word line of the memory cell array 10-1 may be replaced with a redundancy memory cell group connected to a selected redundancy word line of the redundancy memory cell array 10-2, or a memory cell group connected to bit lines selected by a selected column selection signal line may be replaced with a redundancy memory cell group connected to bit lines selected by a selected column selection signal line of the redundancy memory cell array 10-2.

The error code generation unit 14 may receive input data DIN from the data input unit 18, generate an error correction code for the input data DIN, and/or generate write data WD including the data and/or error correction code. The error detection and correction unit 16 may receive read data RD from the memory cell array 10-1 and/or generate an error correction code for data included in the read data RD. The error detection and correction unit 16 may compare an error correction code included in the read data RD with the error correction code generated for the data included in the read data RD and output a comparison result signal "com". Accordingly, if the comparison result signal "com" indicates that the two error correction codes are not identical, the error detection and correction unit 16 may correct an error in the data included in the read data RD by use of the error correction code and/or generate output data DOUT.

The data input unit 18 may receive externally applied data DQ and/or generate input data DIN in response to the write command WE during a write operation. The data output unit 20 may receive output data DOUT and/or output the output data DOUT in response to the read command RE during a read operation. The command decoder 22 may generate a mode setting command MRS, the active command ACT; the write command WE, and/or the read command RE in response to an externally applied command signal COM. The mode setting unit 24 may receive an externally applied mode setting code (not shown) in response to the mode setting command MRS, set a test enable signal TEN for enabling a test operation on memory cells of the memory cell group, and set a program enable signal PEN for programming a defective address (for example, in FIG. 1, it is assumed that the mode setting code is applied through an address input terminal (not shown)). The error classification and storage unit 26 may store the externally applied address ADD in response to the test enable signal TEN if the comparison result signal "com" indicates the error correction code included in the read data RD is identical to the error correction code generated for the data included in the read data RD. If the comparison result signal "com" is generated a desired, or alternatively, a predetermined number of times or more for the same address, the error classification and storage unit 26 may output n-bit defective addresses FADD1 to FADDk (for example, k may be an integer smaller than j). The program control unit 28 may store the defective addresses FADD1 to FADDk, output a high voltage HV (for example, a high-level voltage) and stored defective addresses pFADD1 to pFADDk in response to the program enable signal PEN, generate a program clock signal PCLK, and/or terminate a program in response to a program end signal PEND.

The program unit 30 may include program circuits 30-1 to 30-k. Program circuits 30-1 to 30-k may program the stored defective addresses pFADD1 to pFADDk, respectively, in response to the high voltage HV and/or the program clock signal PCLK, and/or generate programmed defective addresses PFADD1 to PFADDk, respectively. The program end detection unit 32 may generate the program end signal PEND if the defective address pFADD is identical to a corresponding programmed defective address PFADD. The clock generation unit 36 may generate a clock signal CLK and/or clock signals CCLK1 to CCLKk that are enabled in sequence. The first switching unit 34 may sequentially transmit the programmed defective addresses PFADD1 to PFADDk as programmed defective address fADD in response to the clock signals CCLK1 to CCLKk, respectively. The redundancy control unit 40 may operate in response to redundancy signals RU1 to RUj, which may depend on the use of redundancy, and/or the clock signal CLK. Accordingly, if one of the redundancy signals RU1 to RUj corresponds to a case where redundancy is used, the redundancy control unit 40 may disable the enable signal EN and/or generate a switching control signals SC1 to SCj in response to the redundancy signals RU1 to RUj. The second switching unit 38 may switch the programmed defective address fADD to the defective addresses fA1 to fAj in response to the switching control signals SC1 to SCj and/or output the defective addresses fA1 to fAj to redundancy decoders that are not used at the wafer level.

In FIG. 1, the error code generation unit 14, the error detection and correction unit 16, and/or the error classification and storage unit 26 may constitute a first block, e.g., a defective address detection unit 100-1. The defective address detection unit 100-1 may perform a write operation and/or a read operation on the memory cell array 10-1 and/or detect defective addresses during a test operation at a package level. The program control unit 28, the program unit 30, and/or the program end detection unit 32 may constitute a second block, e.g., a defective address program unit 100-2. The defective address program unit 100-2 may store defective addresses and/or program the defective addresses with the application of a high voltage during a program operation of programming the defective addresses detected at the package level. The first switching unit 34, the clock generation unit 36, and the second switching unit 38 may be included in the redundancy control unit 40.

Figure 2:
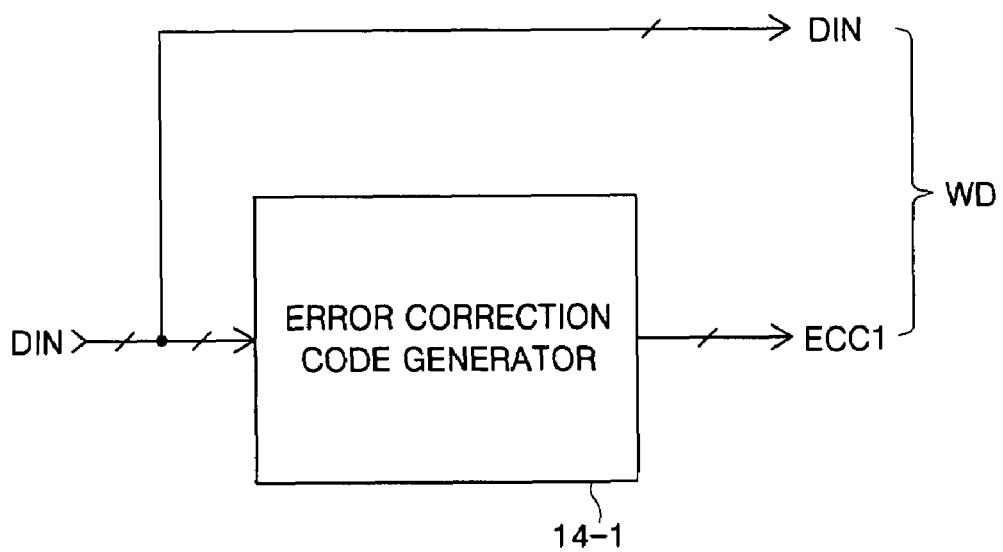
FIG. 2 is a block diagram of an error code generation unit shown in FIG. 1.

FIG. 2 is a block diagram of the error code generation unit 14 shown in FIG. 1.

Referring to FIG. 2, the error code generation unit 14 may include an error correction code generator 14-1. The error correction code generator 14-1 may receive the input data DIN and generate an error correction code ECC1 corresponding to the input data DIN. The error code generation unit 14 may output the input data DIN and the error correction code ECC1 as the write data WD. The error correction code generator 14-1 may be configured to generate the error correction code ECC1 based on a hamming code technique, a cyclic redundancy code (CRC) technique, or any other techniques for generating error correction codes.

Figure 3:
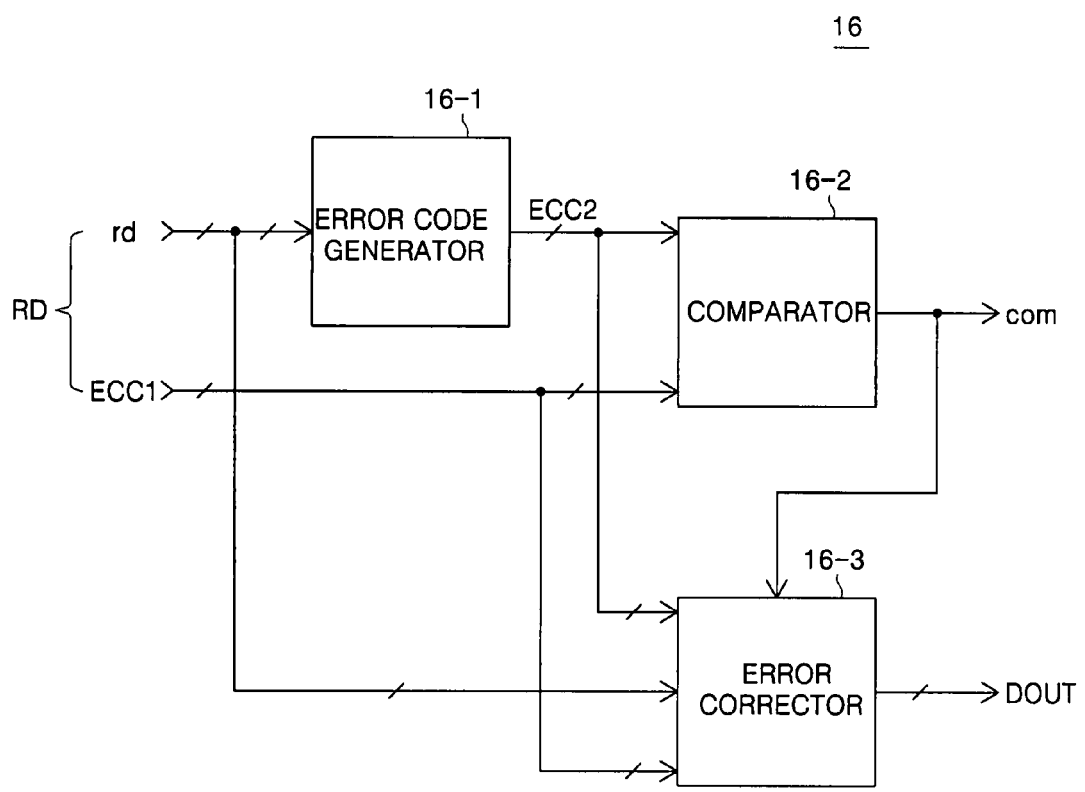
FIG. 3 is a block diagram of an error detection and correction unit shown in FIG. 1.

FIG. 3 is a block diagram of the error detection and correction unit 16 shown in FIG. 1.

Referring to FIG. 3, the error detection and correction unit 16 may include an error code generator 16-1, a comparator 16-2, and/or an error corrector 16-3.

Functions of the blocks shown in FIG. 3 will now be described as follows.

The error code generator 16-1 may receive data "rd" included in the read data RD and output an error correction code ECC2 corresponding to the data "rd". The comparator 16-2 may disable the comparison result signal "com" if the error correction code ECC1 included in the read data RD is identical to the error correction code ECC2, and/or enable the comparison result signal "com" if the error correction code ECC1 is not identical to the error correction code ECC2. In other words, if the error correction codes ECC1 and ECC2 are the same and the comparison result signal "com" is disabled, the error detection and correction unit 16 may indicate that there is no error in the data "rd." If the error correction codes ECC1 and ECC2 are different from each other and the comparison result signal "com" is enabled, the error detection and correction unit 16 may indicate that there is an error in the data "rd". The error corrector 16-3 may receive the error correction codes ECC1 and ECC2 and/or the data "rd", correct the error in the data "rd", and/or generate output data DOUT from the corrected data "rd" if the comparison result signal "com" is enabled. On the other hand, the error corrector 16-3 may directly output the data "rd" as output data DOUT if the comparison result signal "com" is disabled.

Figure 4:
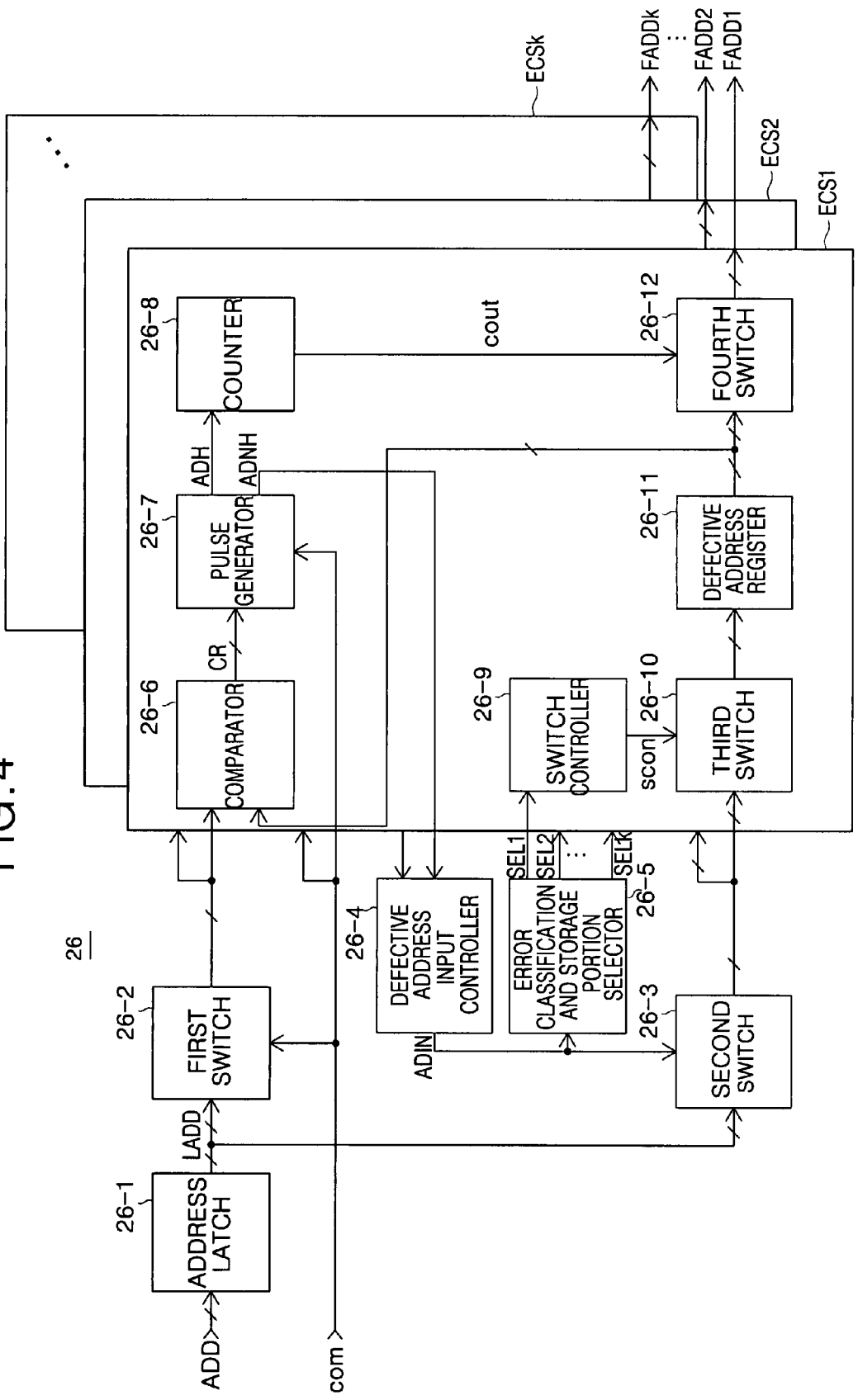
FIG. 4 is a block diagram of an error classification and storage unit shown in FIG. 1.

FIG. 4 is a block diagram of the error classification and storage unit shown in FIG. 1.

Referring to FIG. 4, the error classification and storage unit 26 may include an address latch 26-1, first and second switches 26-2 and 26-3, a defective address input controller 26-4, an error classification and storage portion selector 26-5, and/or error classification and storage portions ECS1 to ECSk. Each of the error classification and storage portions ECS1 to ECSk may include a comparator 26-6, a pulse generator 26-7, a counter 26-8, a switch controller 26-9, a third switch 26-10, a defective address register 26-11, and/or a fourth switch 26-12. The comparator 26-6 and the pulse generator 26-7 may be a comparison and signal generator.

Functions of the blocks shown in FIG. 4 will now be described as follows.

The address latch 26-1 may latch the externally applied address ADD. The first switch 26-2 may transmit the latched address LADD from the address latch 26-1 in response to the comparison result signal "com". In other words, if the comparison result signal "com" is enabled, the first switch 26-2 may be switched on and transmit the latched address LADD. The comparator 26-6 of each of the error classification and storage portions ECS1 to ECSk may compare the address transmitted from the first switch 26-2 with a defective address stored in the defective address register 26-11 of each of the error classification and storage portions ECS1 to ECSk. The comparator 26-6 may enable a comparison result signal CR if the latched address LADD is identical to the defective address, and/or disable the comparison result signal CR if the latched address LADD is not identical to the defective address. The pulse generator 26-7 of each of the error classification and storage portions ECS1 to ECSk may enable an address identity signal ADH in response to the enabling of the comparison result signal CR. On the other hand, the pulse generator 26-7 may enable an address non-identity signal ADNH in response to the disabling of the comparison result signal CR. The counter 26-8 of each of the error classification and storage portions ECS1 to ECSk may perform a counting operation in response to the address identity signal ADH and/or enable a counting output signal "cout" if counting is performed a desired, or alternatively, a predetermined number of times. The defective address input controller 26-4 may enable an address input control signal ADIN if all the address non-identity signals ADNH output from each of the respective error classification and storage portions ECS1 to ECSk are enabled. The error classification and storage portion selector 26-5 may generate selection signals SEL1 to SELk for selecting one of the error classification and storage portions ECS1 to ECSk in response to the address input control signal ADIN. The second switch 26-3 may transmit the latched address LADD output from the address latch 26-1 if the address input control signal ADIN is enabled. The switch controller 26-9 of each of the error classification and storage portions ECS1 to ECSk may enable a switching control signal "scon" in response to each of the respective selection signal SEL1 to SELk output from the error classification and storage portion selector 26-5. The third switch 26-10 of each of the error classification and storage portions ECS1 to ECSk may transmit the address output from the second switch 26-3 in response to the enabling of the switching control signal "scon". The defective address register 26-11 of each of the error classification and storage portions ECS1 to ECSk may store the address output from the third switch 26-10. The fourth switch 26-12 of each of the error classification and storage portions ECS1 to ECSk may output the addresses stored in the address register 26-11 as the defective addresses FADD1 to FADDk if the counting output signal "cout" is activated.

Figure 5:
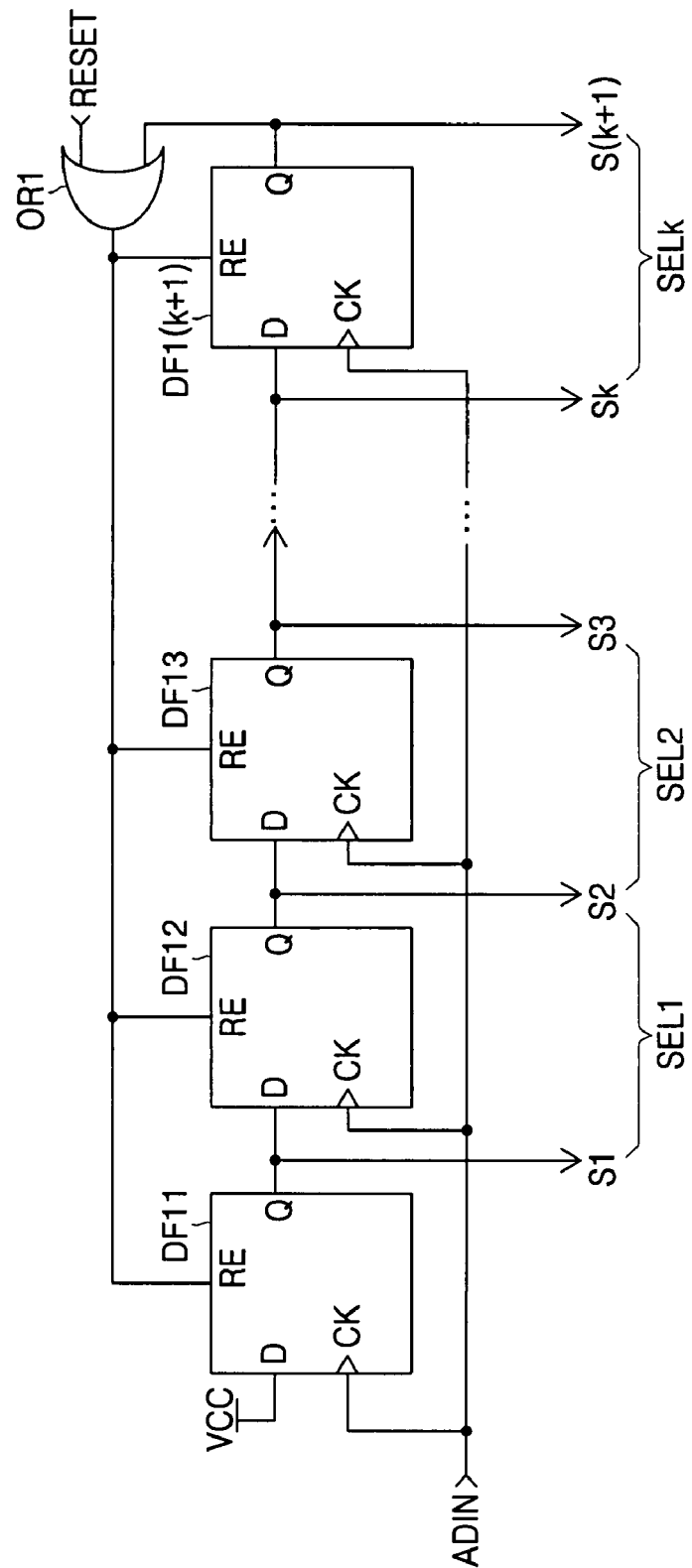
FIG. 5 is a construction diagram of an error classification and storage portion selector shown in FIG. 4.

FIG. 5 is a construction diagram of the error classification and storage portion selector 26-5 shown in FIG. 4. The error classification and storage portion selector 26-5 may include a shift register composed of D flip-flops DF11 to DF(k+1) that may be cascade-connected and/or an OR gate OR1. For example, an input D of D flip-flop DF11 may be connected to a power supply voltage VCC and/or inputs D of D flip-flops DF12 to DF1(k+1) may be connected to outputs Q of D flip-flops DF11 to DF1k.

Functions of the error classification and storage portion selector shown in FIG. 5 will now be described.

The OR gate OR1 may receive a reset signal RESET and/or an output signal s(k+1) of the flip-flop DF(k+1). The output of the OR gate OR1 may be received by the reset input RE of each of the D flip-flops DF11 to DF(k+1). The reset signal RESET may make a low to high transition in an initialization operation and/or make a high to low transition in a desired, or alternatively, a predetermined amount of time. The shift register may be reset to "00 . . . 00" (for example, the outputs signals s1 to s(k+1) output from outputs Q of each D flip-flop DF11 to DF(k+1) may be reset to "00 . . . 00") in response to the reset signal RESET or the output signal s(k+1). Clock inputs CK of the D flip-flops DF11 to DF1(k+1) may receive the address input control signal ADIN. The shift register may be shifted 1-bit by 1-bit in response to the address input control signal ADIN to generate the output signals s1 to s(k+1). If a first address input control signal ADIN is enabled, the D flip-flops DF1 to DF(k+1) may generate output signals s1 to s(k+1) corresponding to "10 . . . 00", and if a k+1-th address input control signal ADIN is enabled, the D flip-flops DF1 to DF(k+1) may generate output signals s1 to s(k+1) corresponding to "00 . . . 01". In this case, two adjacent output signals (s1, s2), (s2, s3), . . . , and (sk, s(k+1)) of the generated output signals s1 to s(k+1) may be output as selection signals SEL1, SEL2, . . . , and SELk, respectively.

In FIG. 4, it is illustrated that the switch controller 26-9 is included in each of the error classification and storage portions ECS1 to ECSk. However, the switch controller 26-9 may be included in the error classification and storage portion selector 26-5.

Figure 6:
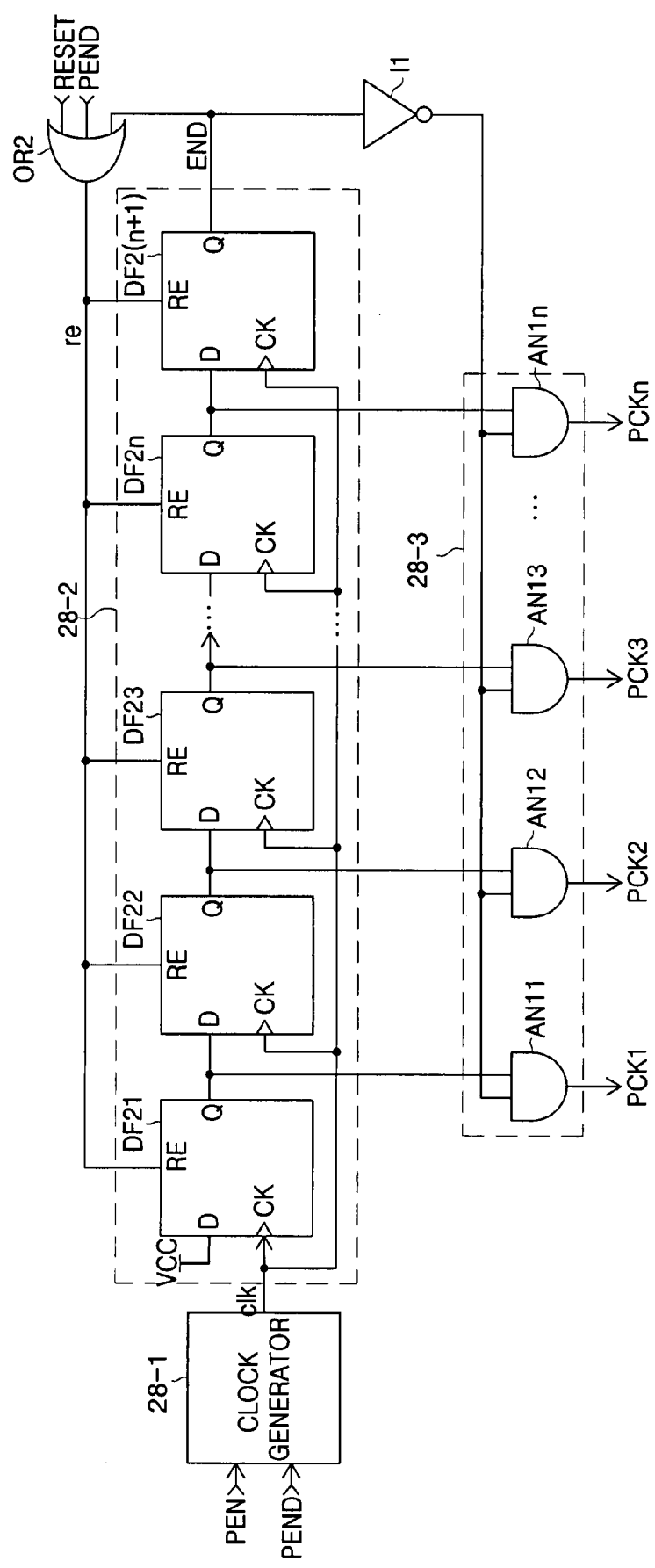
FIG. 6 is a construction diagram of a program control unit shown in FIG. 1.

FIG. 6 is a construction diagram of the program control unit 28 shown in FIG. 1. The program control unit may include a clock generator 28-1, a shift register 28-2, a logic AND circuit 28-3 (for example, a combinational circuit), an OR gate OR2, and/or an inverter I1. The shift register 28-2 may include D flip-flops DF21 to DF2(n+1), and/or the logic AND circuit 28-3 may include AND gates AN11 to AN1n. For example, an input D of D flip-flop DF21 may be connected to the power supply voltage VCC and/or inputs D of D flip-flops DF22 to DF2(n+1) may be connected to outputs Q of D flip-flops DF21 to DF2n. A first input of each AND gate AN11 to AN1n may be connected to the output of the inverter I1 and a second input of each AND gate may be connected to an output Q of corresponding D flip-flops DF21 to DF2n. The shift register 28-2 and the logic AND circuit 28-3 may be a program clock signal generator.

Functions of blocks shown in FIG. 6 will now be described as follows.

The clock generator 28-1 may generate the clock signal "clk" with a desired, or alternatively, a predetermined program period in response to the program enable signal PEN and/or terminate the generation of the clock signal "clk" in response to the program end signal PEND. The clock generator 28-1 may output the high voltage HV (not shown) in response to the program enable signal PEN. Clock inputs CK of the D flip-flops DF21 to DF2(n+1) may receive the clock signal "clk" and/or reset inputs RE of the D flip-flops DF21 to DF2(n+1) may receive an output of the OR gate OR2. The D flip-flops DF21 to DF2(n+1) may be rest with the reset signal "re," which may be output from the OR gate OR2. The D flip-flops DF21 to DF2(n+1) may be reset to "00 . . . 00" (for example, the outputs Q of the D flip-flops DF21 to DF2(n+1) may be reset to "00 . . . 00") in response to a reset signal "re" and shifted 1-bit by 1-bit in response to the clock signal "clk". Because the power supply voltage VCC is applied to an input terminal D of the D flip-flop DF21, an output signal corresponding to "10 . . . 00" may be generated in response to a first clock signal "clk", an output signal corresponding to "00 . . . 10" may be generated in response to an n-th clock signal "clk", and/or an output signal corresponding to "00 . . . 01" may be generated in response to an n+1-th clock signal "clk". For example, a shifting end signal END (for example, the output Q of the flip flop DF2(n+1)) may be enabled in response to the n+1-th clock signal "clk". If the shifting end signal END is disabled, the AND gates AN11 to AN1n may output the output signals of the D flip-flops DF21 to DF2n as program clock signals PCK1 to PCKn, respectively. For example, the inverter I1 may receive the shifting end signal END and output the inverted result to the AND gates AN11 to AN1n. The OR gate OR2 may generate the reset signal "re" if the reset signal RESET, the program end signal END, or the shifting end signal END is enabled.

In an example embodiment, the program control unit shown in FIG. 6 may sequentially generate the program clock signals PCK1 to PCKn with program periods.

Figure 7:
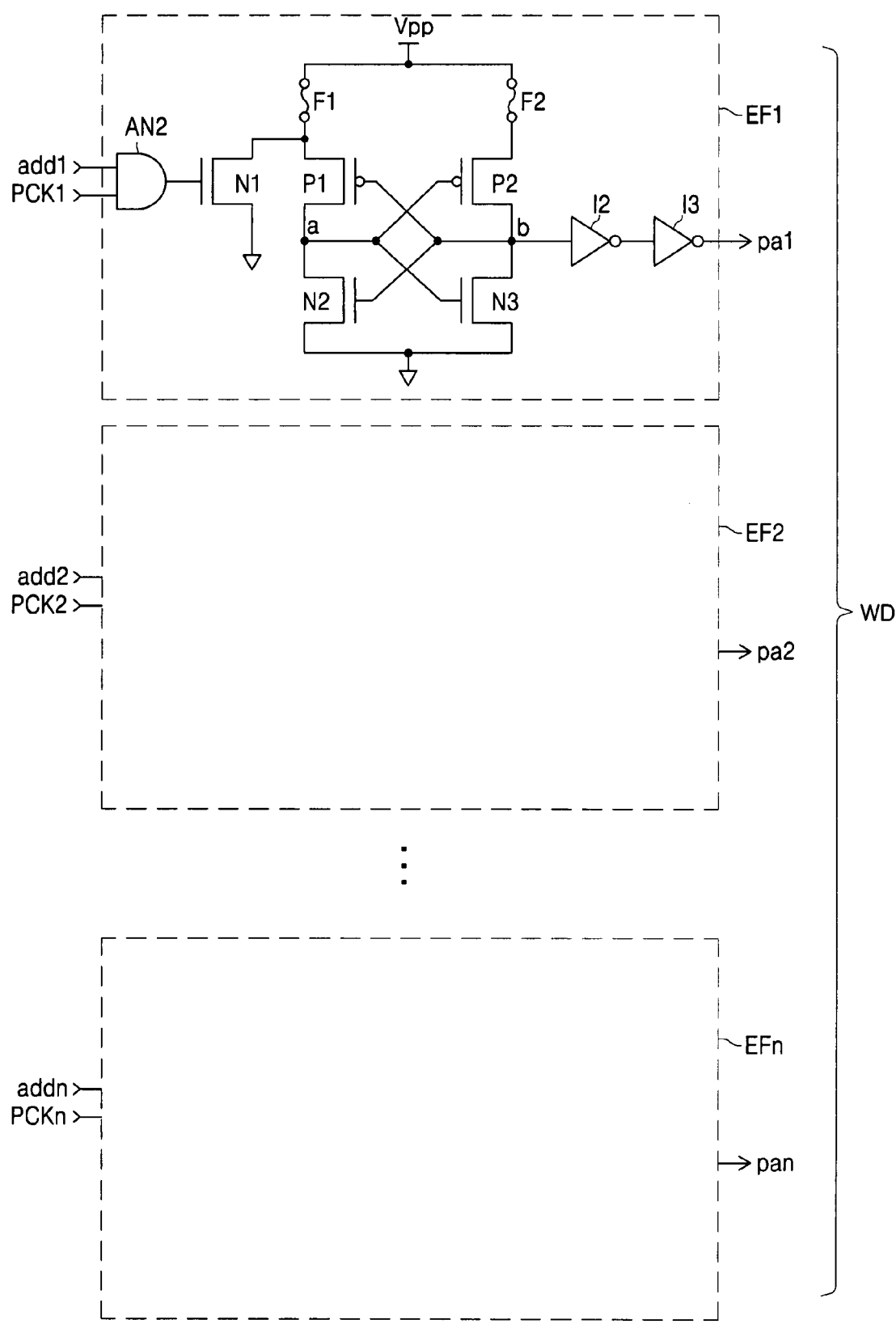
FIG. 7 is an example circuit diagram of a program circuit shown in FIG. 1.

FIG. 7 is a circuit diagram of the program unit 30 including program circuits 30-1 to 30-k shown in FIG. 1.

Referring to FIG. 7, the program circuits 30-1 to 30-k may include electrical fuse circuits EF1 to EFn. Each electrical fuse circuit EF1 to EFn may include an AND gate AN2, fuses F1 and F2, PMOS transistors P1 and P2, NMOS transistors N1, N2, and N3, and/or inverters I2 and I3.

In an example embodiment in FIG. 7, the program circuits 30-1 to 30-k may be designed such that the resistance of the fuse F1 is lower than the resistance of the fuse F2.

The operation of the electrical fuse circuit EF1 shown in FIG. 7 will now be described.

If the fuse F1 is not cut, a voltage at a node "a" may be higher than a voltage at a node "b". The inverters I2 and I3 may buffer a low-level signal at the node "b" and/or generate a low-level programmed defective address "pa1".

In a program operation, if the high voltage HV is applied to a power supply voltage VPP and a high-level address "add1" is input to the electrical fuse circuit EF1 in response to a high-level programmed clock signal PCK1, the AND gate AN2 may generate a high-level signal. Accordingly, the NMOS transistor N1 may be turned on, so that a current of several mA may pass through the fuse F1 and the fuse F1 is cut. The PMOS transistor P2 may be turned on in response to a low-level signal at the node "a", so that a signal at the node "b" transitions to a high level. The inverters I2 and I3 may buffer the high-level signal and generate a high-level programmed defective address "pa1". The high-level signal at the node "b" may be latched and held by the PMOS transistors P1 and P2 and the NMOS transistors N2 and N3.

On the other hand, if the high voltage HV is applied to the power supply voltage VPP1 and a low-level address "add1" is input to the electrical fuse circuit EF1 in response to the high-level programmed clock signal PCK1 in a program operation, the AND gate AN2 may generate a low-level signal. Accordingly, the NMOS transistor N1 may be turned off.

The inverters I2 and I3 may buffer the low-level signal and generate a low-level programmed defective address "pa1". The low-level signal at the node "b" may be latched and held by the PMOS transistors P1 and P2 and the NMOS transistors N2 and N3.

The remaining electrical fuse circuits EF2 to EFn may operate in the same manner as the above-described electrical fuse circuit EF1.

The above-described program control unit 28 and program circuits 30-1 to 30-$k$ may sequentially program at least one defective address 1-bit by 1-bit at the same time in response to each of the sequentially enabled program clock signals PCK1 to PCKk. If the program unit 30 includes k program circuits 30-1 to 30-$k$ to program k defective addresses, each 1 bit of the k defective addresses may be programmed in response to the program clock signals PCK1 to PCKn. Accordingly, if there are only one or two defective addresses, the one or two defective addresses may be sequentially programmed 1-bit by 1-bit at the same time, so that a very small amount of current may be consumed and/or stress applied to the semiconductor memory device may be reduced.

Although it is described above according to an example embodiment that the program control unit 28 and program circuits 30-1 to 30-$k$ may sequentially program the defective address 1-bit by 1-bit at the same time, example embodiments are not limited thereto. In another example embodiment, the program control unit 28 and program circuits 30-1 to 30-$k$ may sequentially program the defective address by a desired, or alternatively, a predetermined number of bits at the same time.

Figure 8:
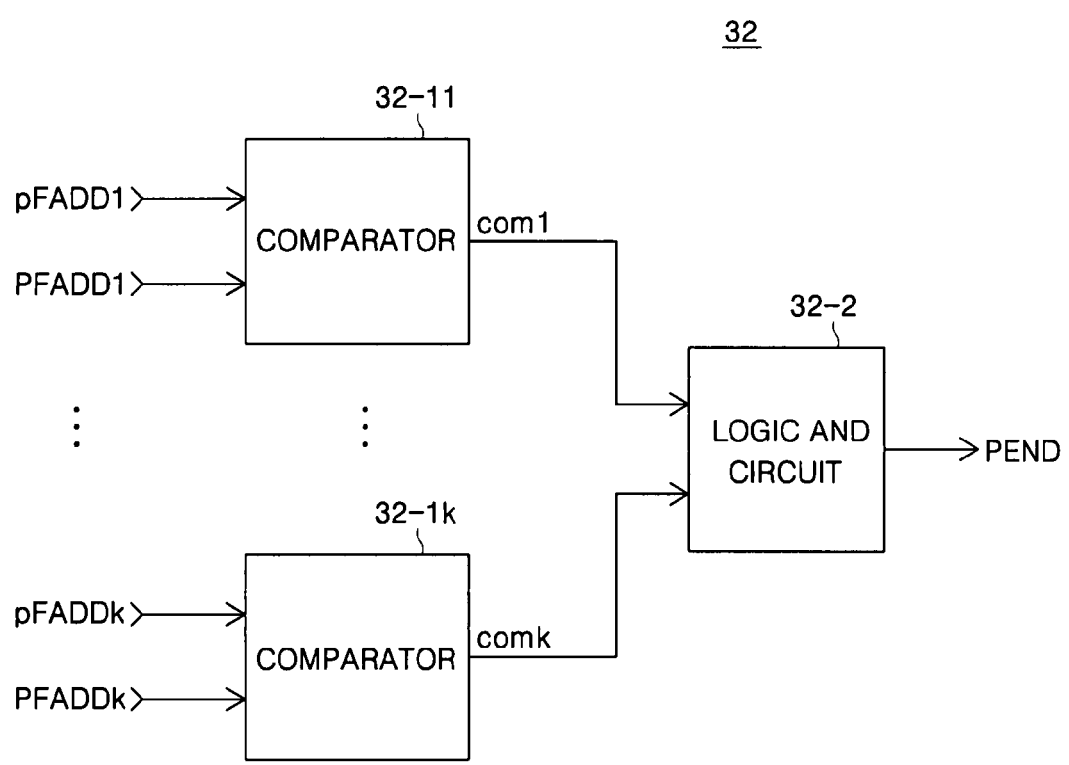
FIG. 8 is a block diagram of a program end detection unit shown in FIG. 1.

FIG. 8 is a block diagram of the program end detection unit 32 shown in FIG. 1. The program end detection unit 32 may include comparators 32-11 to 32-1$k$ and/or a logic AND circuit 32-2.

Functions of blocks shown in FIG. 8 will now be described.

The comparator 32-11 may enable a comparison result signal "com1" if the stored defective address pFADD1 is identical to the programmed defective address PFADD1. The comparators 32-12 to 32-1$k$ may enable comparison result signals "com2 to comk", respectively, if the stored defective addresses pFADD2 to pFADDk are identical to the programmed defective addresses PFADD2 to PFADDk, respectively. The logic AND circuit 32-2 may enable the program end signal PEND if all the comparison result signals "com1 to comk" are enabled.

For example, the program end detection unit 32 shown in an example embodiment in FIG. 8 may generate the program end signal PEND if it detects the end of the program operation which the program unit performs on all defective addresses.

Figure 9:
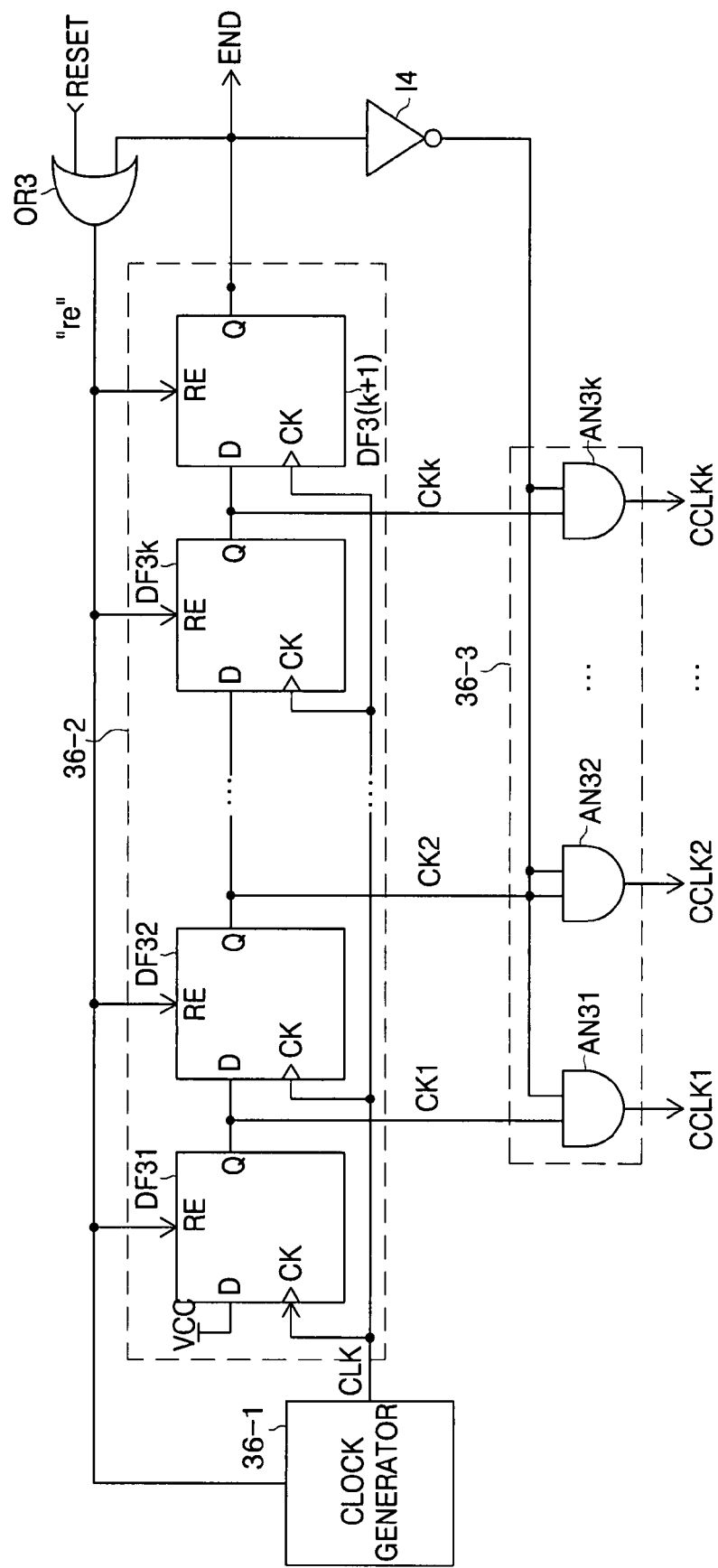
FIG. 9 is a construction diagram of a clock generation unit shown in FIG. 1.

FIG. 9 is a construction diagram of the clock generation unit 36 shown in FIG. 1.

Referring to FIG. 9, the clock generation unit 36 may include a clock generator 36-1, a shift register 36-2, a logic AND circuit 36-3, an OR gate OR3, and/or an inverter I4. The shift register 36-2 may include D flip-flops DF31 to DF3(k+1), and/or the logic AND circuit 36-3 may include AND gates AN31 to AN3$k$. An input D of the D flip-flop DF31 may be connected to the power supply voltage VCC, and inputs D of the D flip-flops DF32 to DF3(k+1) may be connected to outputs Q of the D flip-flops DF31 to DF3$k$. The OR gate OR3 may receive the reset signal RESET and a shifting end signal END and generate the reset signal "re." Each of the D flip-flops DF32 to DF3(k+1) may be configured to receive the reset signal "re."

Functions of blocks shown in FIG. 9 will now be described.

The clock generator 36-1 may generate a clock signal CLK in response to an externally applied clock signal or the clock generator 36-1 may generate the clock signal CLK internally. The clock generator 36-1 may terminate the generation of the clock signal CLK in response to the reset signal "re". The shift register 36-2 may perform a shifting operation in response to the clock signal "CLK". The D flip-flops DF31 to DF3(k+1) may be initialized to "00 . . . 00" (for example, the outputs Q of the D flip-flops DF31 to DF3(k+1) may be initialized to "00 . . . 00") in response to the reset signal "re" and/or shifted 1-bit by 1-bit in response to the clock signal CLK. For example, in the D flip-flops DF31 to DF3(k+1), an output signal corresponding to "10 . . . 00" may be generated if a first clock signal CLK is enabled, an output signal corresponding to "00 . . . 10" may be generated if a k-th clock signal CLK is enabled, and an output signal corresponding to "00 . . . 01" is generated if a k+1-th clock signal CLK is enabled. If the shifting end signal END (for example, an output Q of the D flip-flop DF3(k+1)) is enabled to a high level, the D flip-flops DF31 to DF3(k+1) may be reset to "00 . . . 00". The logic AND circuit 36-3 may output the output signals of the D flip-flops DF31 to DF3$k$ (for example, output signals CK1 to CKk as shown in FIG. 9) as switching clock signals CCLK1 to CCLKk if the shifting end signal END is disabled to a low level.

The clock generator 36-1 of example embodiments shown in FIG. 9 may generate the switching clock signals CCLK1 to CCLKk which may be sequentially enabled in response to the clock signal CLK.

Figure 10:
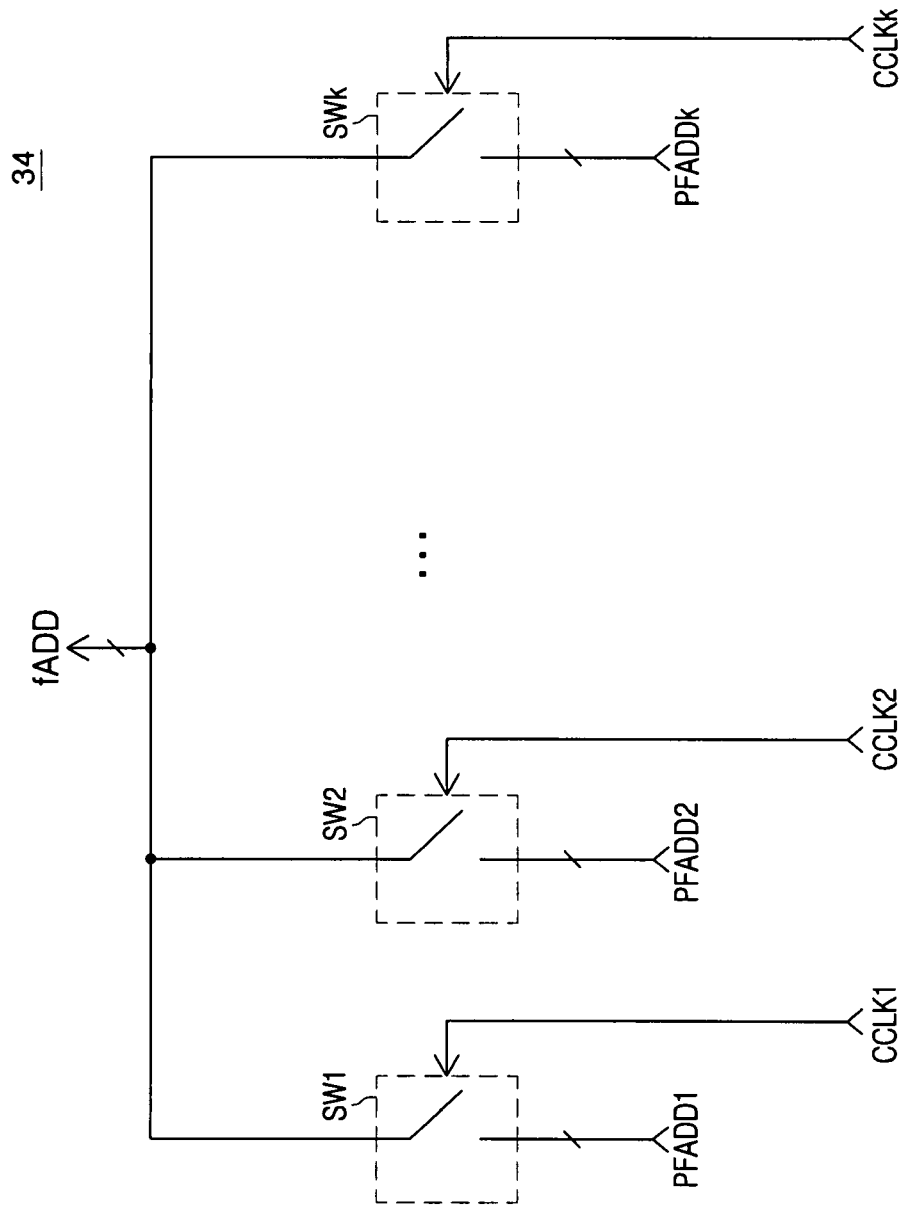
FIG. 10 is a construction diagram of a first switching unit shown in FIG. 1.

FIG. 10 is a construction diagram of the first switching unit 34 shown in FIG. 1.

Referring to FIG. 10, the first switching unit 34 may include switches SW1 to SWk. Switches SW1 to SWk may sequentially transmit the programmed defective addresses PFADD1 to PFADDk as defective addresses fADD to the second switching unit 38 in response to the switching clock signals CCLK1 to CCLKk, respectively.

Figure 11:
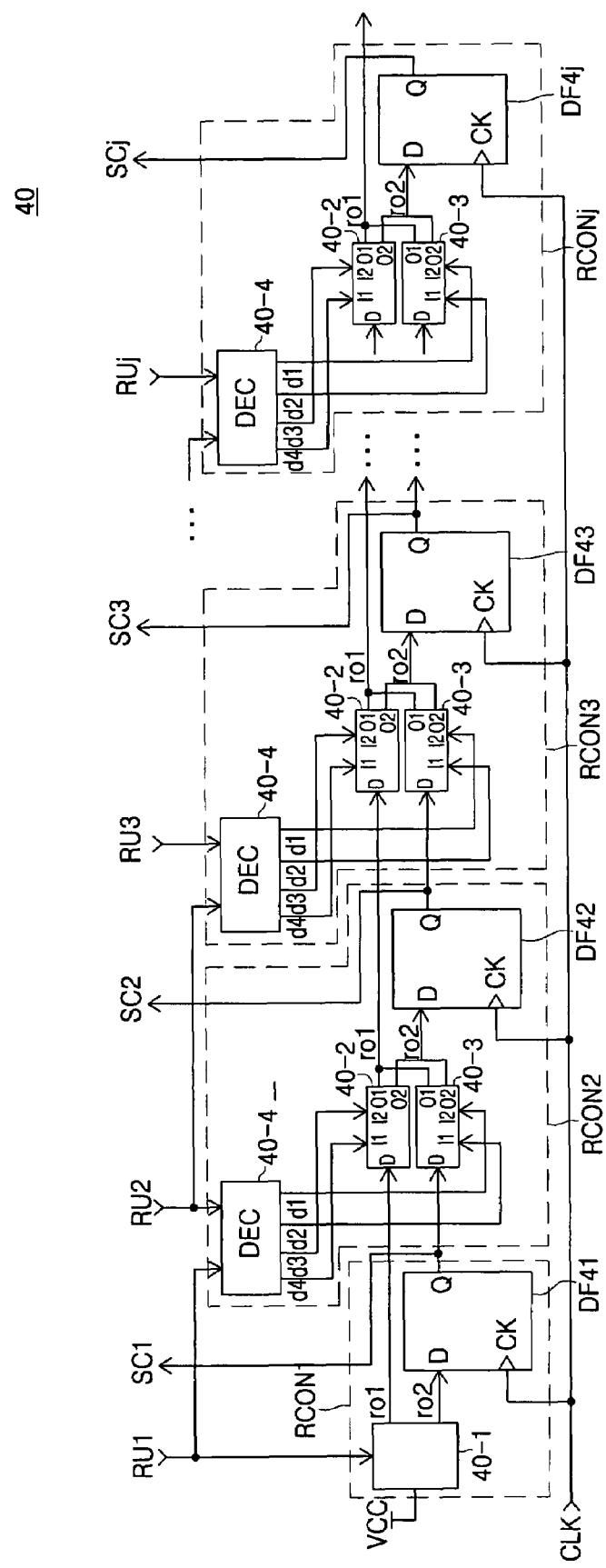
FIG. 11 is a construction diagram of the redundancy control unit shown in FIG. 1.

FIG. 11 is a construction diagram of the redundancy control unit 40 shown in FIG. 1.

Referring to FIG. 11, the redundancy control unit 40 may include redundancy control circuits RCON1 to RCONj. The redundancy control circuit RCON1 may include a selector 40-1 and/or a D flip-flop DF41. The redundancy control circuits RCON2 to RCONj may include D flip-flops DF42 to DF4$j$, respectively, selectors (SEL1 and SEL2) 40-2 and 40-3, and/or a decoder (DEC) 40-4.

Functions of blocks shown in FIG. 11 will now be described as follows.

The redundancy control circuit RCON1 may transmit a power supply voltage VCC as a first output signal "ro1" and/or enable the first output signal "ro1" if a redundancy signal RU1 indicates the use of redundancy. The redundancy control circuit RCON1 may enable a second output signal "ro2" and/or generate the second output signal "ro2" as a switching control signal SC1 in response to the clock signal CLK if the redundancy signal RU1 indicates the disuse of redundancy. For example, the selector 40-1 may transmit the power supply voltage VCC as the first output signal "ro1" to the selector SEL2 40-2 of the redundancy control circuit RCON2 if the redundancy signal RU1 indicates the use of redundancy, and/or transmit the power supply voltage VCC to the D flip-flop DF41 if the redundancy signal RU1 indicates the disuse of redundancy. The D flip-flop DF41 may output the second output signal "ro2" as the switching control signal SC1 in response to the clock signal CLK. The redundancy control circuits RCON2 to RCONj may each receive and/or decode two adjacent redundancy signals (RU1, RU2), (RU2, RU3), . . . , and (RU(j−1), RUj), respectively, and/or each generate four decoding signals d4 to d1. The redundancy control circuits RCON2 to RCONj may transmit the decoding signal d4 as the first output signal "ro1" if the first output signal "ro1" of the immediately previous redundancy control circuit located at a front end is enabled, and/or transmit the decoding signal d3 as the second output signal "ro2" if the first output signal "ro1" of the immediately previous redundancy control circuit located at the front end is disabled. The redundancy control circuits RCON2 to RCONj may transmit the decoding signal d2 as the first output signal "ro1" if the output signal of the D flip-flop of the immediately previous redundancy control circuit located at the front end is enabled, and transmit the decoding signal d1 as the second output signal "ro2" if the output signal of the D flip-flop of the immediately previous redundancy control circuit located at the front end is disabled. In other words, the redundancy control circuits RCON2 to RCONj may enable the first output signal "ro1" if all the two adjacent redundancy signals (RU1, RU2), (RU2, RU3), . . . , and (RU(j−1), RUj) indicate the use of redundancy or if redundancy signals RU2, RU3, . . . , and RUj of the two adjacent redundancy signals (RU1, RU2), (RU2, RU3), . . . , and (RU(j−1), RUj) indicate the use of redundancy. The redundancy control circuits RCON2 to RCONj may enable the second output signal "ro2" and/or generate the second output signal "ro2" as switching control signals SC2 to SCj in response to the clock signal CLK if all the two adjacent redundancy signals (RU1, RU2), (RU2, RU3), . . . , and (RU(j−1), RUj) indicate the use of redundancy or if redundancy control signals RU1, RU2, . . . , and RU(j−1) of the two adjacent redundancy signals (RU1, RU2), (RU2, RU3), . . . , and (RU(j−1), RUj) indicate the use of redundancy.

The decoder (DEC) 40-4 of each of the redundancy control circuits RCON2 to RCONj may decode the two adjacent redundancy signals (RU1, RU2), (RU2, RU3), . . . , and (RU(j−1), RUj), enable the decoding signal d1 if the redundancy signals are decoded to be "00", enable the decoding signal d2 if the redundancy signals are decoded to be "01", enable the decoding signal d3 if the redundancy signals are decoded to be "10", and/or enable the decoding signal d4 if the redundancy signals are decoded to be "11".

The selector 40-2 of each of the redundancy control circuits RCON2 to RCONj may output the decoding signal d4 applied to a first input terminal I1 from a first output terminal O1 if an input signal (for example, the first output signal "ro1" of the preceding D flip-flop) applied to a data terminal D is at a low level, and/or output the decoding signal d3 applied to a second input terminal I2 from a second output terminal O2 if the input signal (for example, the first output signal "ro1" of the preceding D flip-flop) applied to the data terminal D is at a high level.

The selector 40-3 of each of the redundancy control circuits RCON2 to RCONj may output the decoding signal d2 applied to the first input terminal I1 from the first output terminal O1 if the input signal (for example, the output Q of the preceding D flip-flop) applied to the data terminal D is at a low level, and/or output the decoding signal d1 applied to the second input terminal I2 from the second output terminal O2 if the input signal (for example, the output Q of the preceding D flip-flop) applied to the data terminal D is at a high level. Each of the D flip-flops DF42 to DF4j may initialized to "00 . . . 00" (for example, the outputs Q of each the D flip-flops DF42 to DF4j may be set to 0), store the second output signal "ro2" in response to the clock signal CLK, and/or generate the second output signals "ro2" as the switching control signals SC2 to SCj, respectively.

The redundancy control unit 40 shown in FIG. 11 may receive two adjacent redundancy signals and/or sequentially enables the switching control signals SC2 to SCj corresponding to unused redundancy signals depending on the use or disuse of redundancy indicated by the two adjacent redundancy signals.

Figure 12:
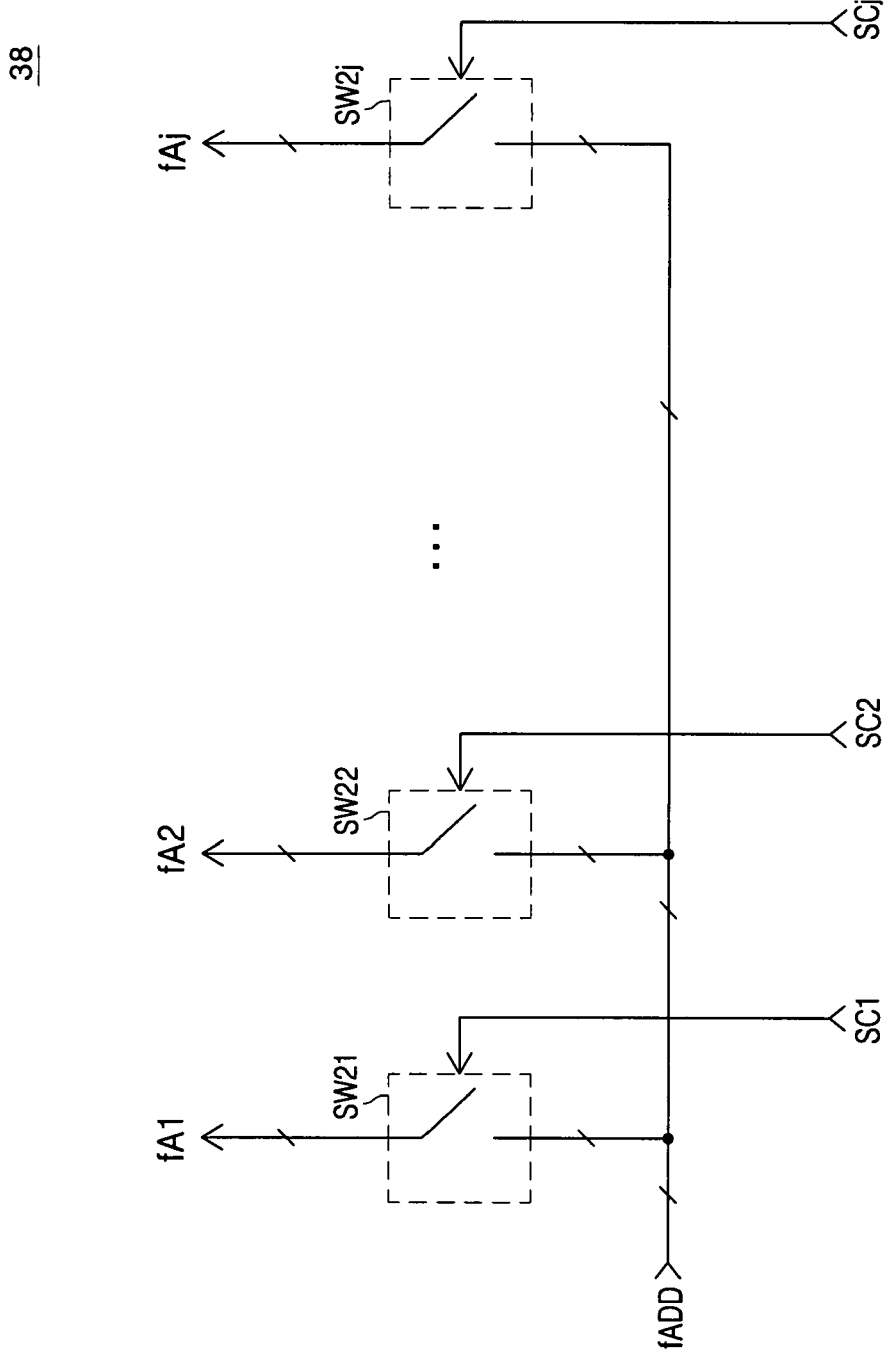
FIG. 12 is a construction diagram of a second switching unit shown in FIG. 1.

FIG. 12 is a construction diagram of the second switching unit 38 shown in FIG. 1.

Referring to FIG. 12, the second switching unit 38 may include switches SW21 to SW2j. The switches SW21 to SW2j may transmit defective addresses fADD through selected switches in response to the switching control signals SC1 to SCj, respectively. For example, if the switching control signal SC2 is enabled, the switch SW22 may be turned on and/or transmit the defective address fADD as an address fA2.

The second switching unit shown in FIG. 12 may transmit the sequentially output defective addresses fADD as corresponding addresses fA1 to fAj in response to the sequentially output switching control signals SC1 to SCj, respectively.

Figure 13:
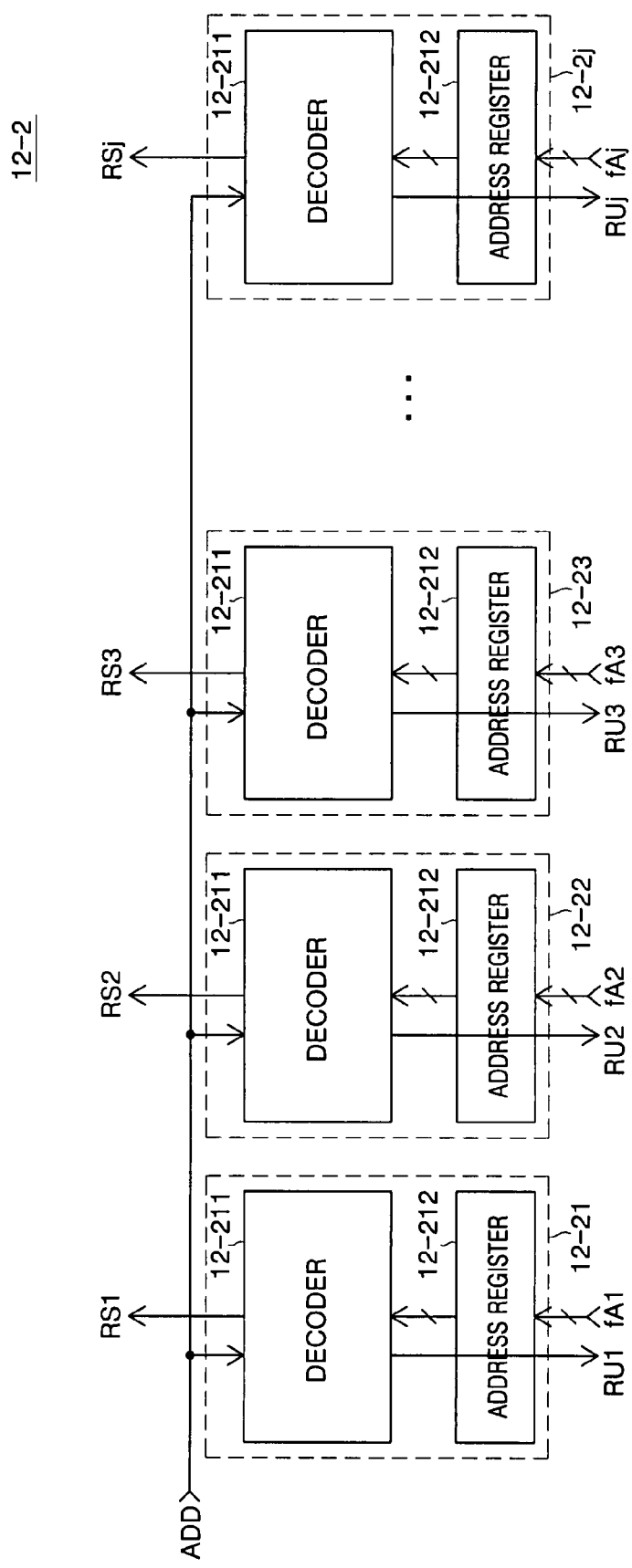
FIG. 13 is a construction diagram of a redundancy address decoder shown in FIG. 1.

FIG. 13 is a construction diagram of the redundancy address decoder 12-2 shown in FIG. 1.

Referring to FIG. 13, the redundancy address decoder may include the redundancy decoders 12-21 to 12-2j, each of which may include a decoder 12-211 and an address register 12-212.

Functions of components shown in FIG. 13 will now be described.

The address registers 12-212 of the redundancy decoders 12-21 to 12-2j may store and/or output the defective addresses fA1 to fAj, respectively. The decoders 12-211 of the redundancy decoders 12-21 to 12-2j may enable redundancy selection signals RS1 to RSj, respectively, and output the redundancy signals RU1 to RUj, respectively, which indicate the use or disuse of redundancy at a wafer level, if a defective address corresponding to a defective memory cell found as the result of a test at the wafer level is programmed and the externally applied address ADD that is externally applied in a normal operation is identical to the programmed defective address or the defective address output from the address register 12-212. Accordingly, the redundancy signals RU1 to RUj may indicate the use or disuse of redundancy, for example, at a wafer level.

Figure 14:
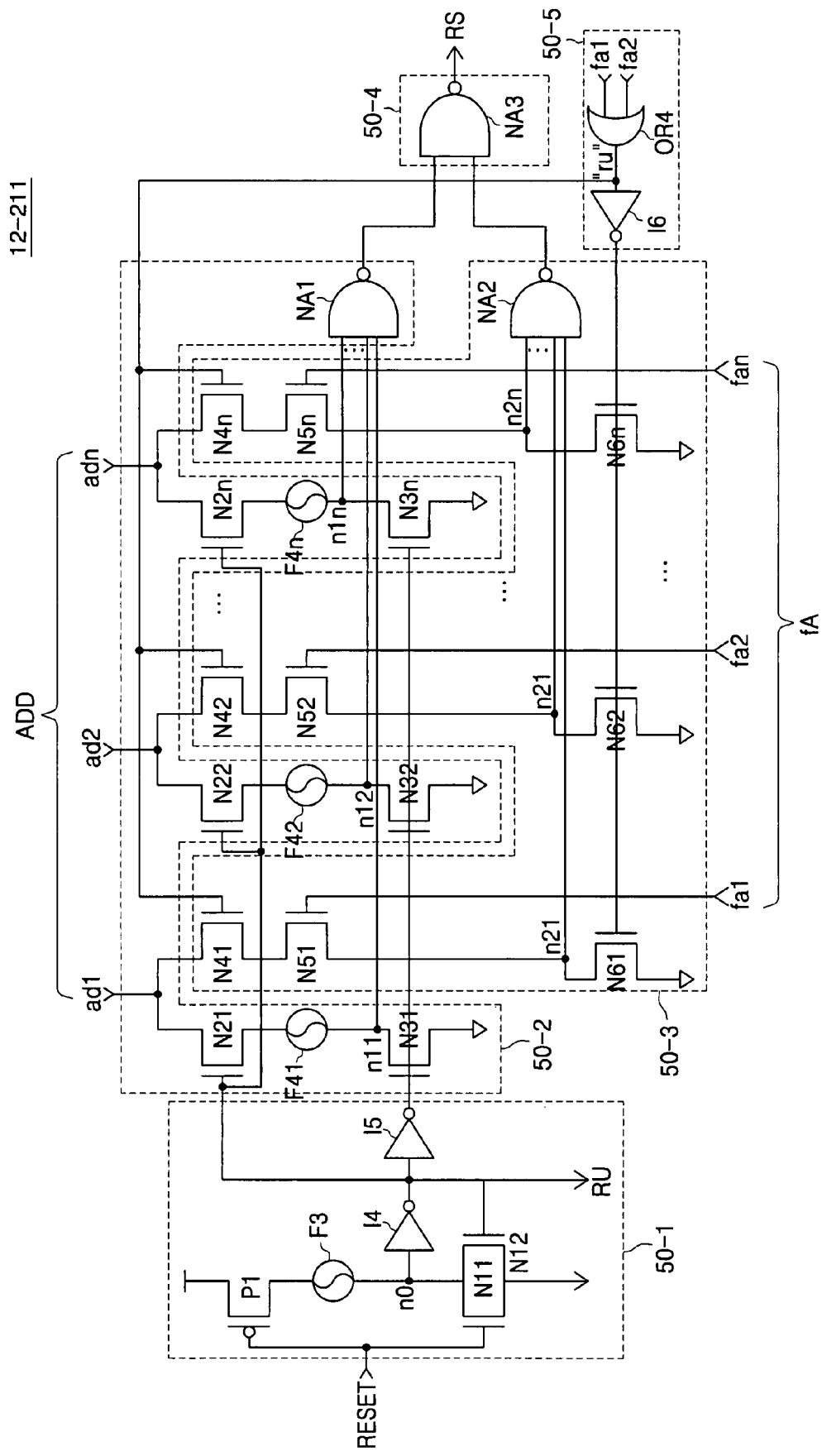
FIG. 14 is an example circuit diagram of a decoder shown in FIG. 13.

FIG. 14 is a circuit diagram of the decoder 12-211 shown in FIG. 13.

Referring to FIG. 14, the decoder 12-211 may include a first redundancy signal generator 50-1, a second redundancy signal generator 50-5, a first decoding portion 50-2, a second decoding portion 50-3, and/or a redundancy selection signal generator 50-4. The first redundancy signal generator 50-1 may include a PMOS transistor P1, NMOS transistors N11 and N12, a fuse F3, and/or inverters I4 and I5. The fuse F3 may be a break-link fuse. The second redundancy signal generator 50-5 may include an OR gate OR4 and/or an inverter I6. The first decoding portion 50-2 may include NMOS transistors N21 to N2n, fuses F41 to F4n, NMOS transistors N31 to N3n, and a NAND gate NA1. Fuses F41 to F4n may each be between corresponding NMOS transistors N21 to N2n and N31 to N3n, and the sources of NMOS transistors N31 to N3n may be connected to the ground. The second decoding portion 50-3 may include NMOS transistors N41 to N4n, N51 to N5n, and N61 to N6n, and/or a NAND gate NA2. The redundancy selection signal generator 50-4 may include a NAND gate NA3. NMOS transistors N41 to N4n, N51 to N5n, and N61 to N6n may each be connected in series, and the sources of NMOS transistors N61 to N6n may be connected to the ground (for example NMOS transistors N41, N51, and N61 may be connected in series). The drains of NMOS transistors N21 to N2n of the first decoding portion 50-2 may be connected to the drains of NMOS transistors N41 to N4n, respectively.

In FIG. 14, the reset signal RESET may make a low-to-high transition in an initialization operation and/or make a downward transition, for example a high-to-low transition, in a desired, or alternatively, a predetermined amount of time. The reset signal RESET may be a signal generated in the semiconductor memory device or an externally applied signal. The reset signal RESET may be applied to the first redundancy signal generator 50-1.

In FIG. 14, 2-bit addresses (ad1, ad2), . . . , and (ad(n−1), adn) may be pairs of inverted addresses of an externally applied address ADD, and 2-bit defective addresses (fa1, fa2), . . . , and (fa(n−1), fan) may be pairs of inverted defective addresses.

Functions of blocks shown in FIG. 14 will now be described.

In the first redundancy signal generator 50-1, a defective address detected at a wafer level will be used for a program operation based on the cutting of the fuse F3. Accordingly, if the fuse F3 is cut, the NMOS transistor N11 may be turned on in response to the reset signal RESET and/or send a signal at a node "n0" to a low level. The inverter I4 may invert the low-level signal at the node "n0" and/or generate a high-level redundancy signal RU. If the reset signal RESET makes a high-to-low transition, the NMOS transistor N11 may be turned off. The NMOS transistor N12 may be turned on in response to the high-level redundancy signal RU and/or keep the signal at the node "n0" at a high level. In contrast, if the fuse F3 is not cut, the NMOS transistor N11 may be turned on in response to the high-level reset signal RESET and/or send the signal at the node "n0" to a low level. The inverter I4 may invert the low-level signal at the node "n0" and/or generate a high-level redundancy signal RU. If the reset signal RESET makes a high-to-low transition, the PMOS transistor P1 may be turned on and/or send the signal at the node "n0" to a high level. The inverter I4 may invert the high-level signal and/or generate a low-level redundancy signal RU. The inverter I5 may invert the redundancy signal RU.

The first decoding portion 50-2 may serve to program the defective address found at the wafer level. Accordingly, the first decoding portion 50-2 may cut a fuse F4n and not cut the remaining fuses F41 to F4(n−1) if the defective address found at the wafer level is "11 . . . 10". If the high-level redundancy signal RU is generated, all the NMOS transistors N21 to N2n may be turned on, and/or all the NMOS transistors N31 to N3n may be turned off. Because the fuse F4n of the first decoding portion 50-2 is cut, if an externally applied address (ADD) ad1, ad2, . . . ad(n−1_), adn is "11 . . . 10", the addresses ad1 to ad(n−1), except an address "adn," may be transmitted, so that signals at nodes n11 to n1(n−1) at the drains of NMOS transistors N31 to N3(n−1) may transition to a high level. The NAND gate NA1 may generate a low-level signal based on the signals at nodes n11 to n1n, and/or the NAND gate NA2 may generate a high-level signal based on the signals at nodes n21 to n2n. If the low-level signal is generated, all the NMOS transistors N31 to N3n may be turned on, and/or all the NMOS transistors N21 to N2n may be turned off. Accordingly, all signals at the nodes n11 to n1n may transition to a low level, and the NAND gate NA1 may generate a high-level signal.

The second redundancy signal generator 50-5 may combine a 1-bit address of defective addresses (FADD) fa1fa2 . . . fan with an inverted address of the 1-bit address and/or generate a redundancy signal "ru". For example, the second redundancy signal generator 50-5 may detect that the defective address FADD has been input and generate the redundancy signal "ru". The OR gate OR4 may receive the defective address FADD, perform a logic OR operation on a 1-bit address fa1 and an inverted address fa1b, and/or generate a high-level redundancy signal "ru". The inverter 16 may invert the redundancy signal "ru".

The second decoding portion 50-3 may serve to program a defective address detected at a package level. The second decoding portion 50-3 may be used if the first decoding portion 50-2 is not used. If the high-level redundancy signal "ru" is generated, all the NMOS transistors N41 to N4n may be turned on, and/or all the NMOS transistors N61 to N6n may be turned off. If the defective address FADD is "11 . . . 10" and an externally applied address ADD is "11 . . . 10", the NMOS transistors N51 to N5(n−1) may be turned on so that signals at nodes n21 to n2(n−1) (for example signals at nodes between NMOS transistors N51 to N5(n−1) and N61 to N6(n−1)) transition to a high level. The NAND gate NA2 may generate a low-level signal based on the signals at nodes n21 to n2n, and/or the NAND gate NA3 may generate a high-level redundancy selection signal RS. If the low-level redundancy signal "ru" is generated, all the NMOS transistors N61 to N6n may be turned on, and/or all the NMOS transistors N41 to N4n are turned off, so that signals at nodes n21 to n2n may transition to a low level. Accordingly, the NAND gate NA2 may generate a high-level signal based on the signals at nodes n21 to n2n.

The redundancy selection signal generator 50-4 may generate from the NAND gate NA3 a low-level redundancy selection signal RS if all the output signals of the NAND gates NA1 and NA2 are at a high level and/or generate a high-level redundancy selection signal RS if one of the output signals of the NAND gates NA1 and NA2 is at a low level.

As described above, the redundancy decoder shown in example embodiments in FIG. 13 may be capable of programming the defective address detected at the wafer level or the defective address detected at the package level.

Figure 15:
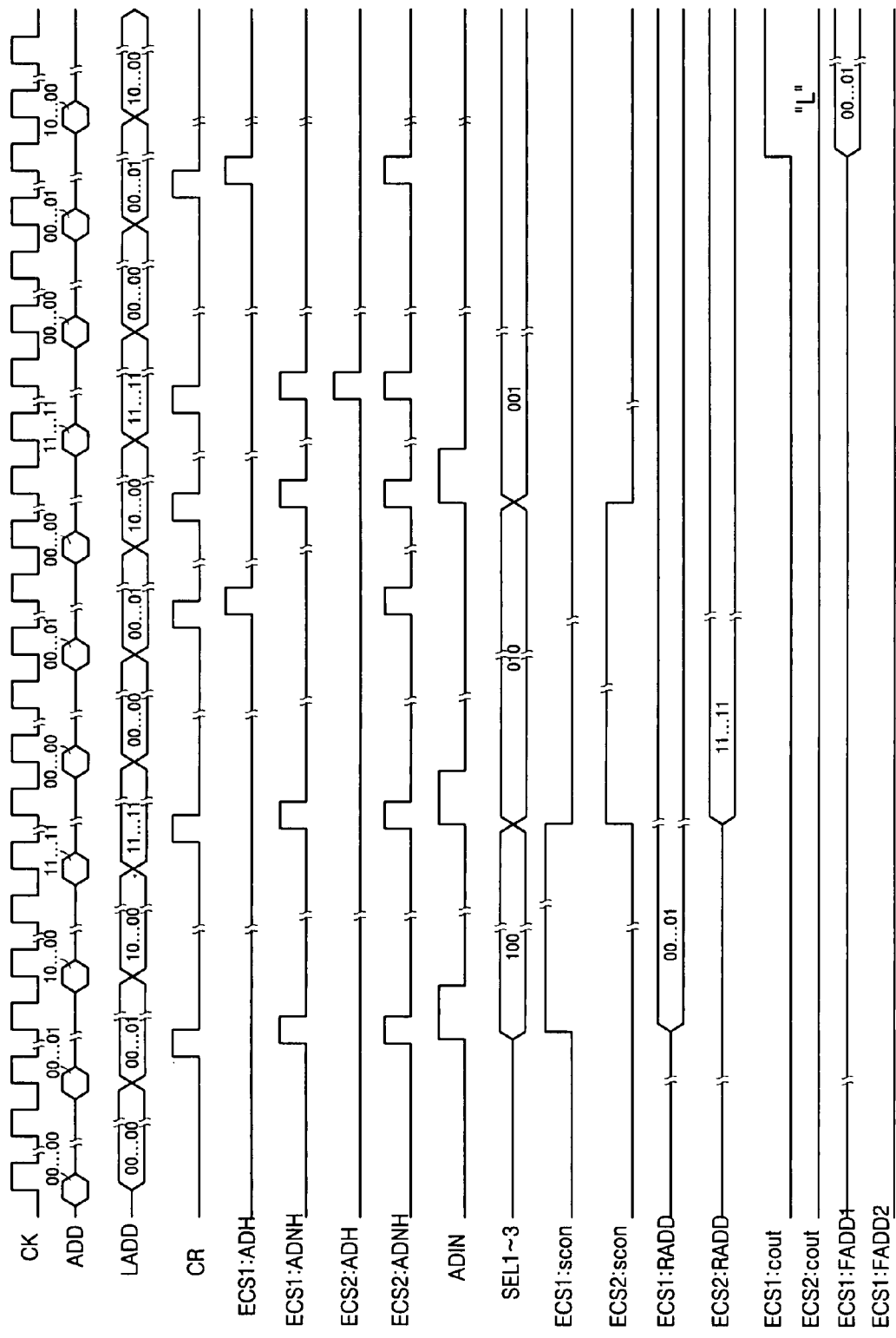
FIG. 15 is an example timing diagram illustrating a test operation of a semiconductor memory device according to an example embodiment.

FIG. 15 is an example timing diagram illustrating a test operation of a semiconductor memory device according to an example embodiment. The test operation illustrated in FIG. 15 may be performed on all the memory cells of the memory cell array 10-1. During the test operation, a test enable signal TEN may be enabled, the address ADD may be externally applied in response to the clock signal CLK so that test data is stored in the corresponding memory cell, and/or the test data may be read from the corresponding memory cell. Because there may be 8 test data (however, example embodiments are not limited thereto and there may be more or less than 8 test data), a write operation and/or a read operation may be performed 8 times on all the memory cells of the memory cell array. If an error is caused in the same address 3 times or more, the corresponding address may be output as a defective address. The test operation may be performed in a case where the counter 26-8 of the error classification and storage unit shown in FIG. 4 outputs a counting output signal "cout" if "01" is counted, the error classification and storage unit may include two error classification and storage portions, and the error classification and storage portion selector 26-5 may include a 3-bit shift register. Reference numeral LADD refers to an address latched in the address latch (26-1 in FIG. 4).

Referring to FIGS. 1 and 4, the address ADD may be externally applied in response to the clock signal CLK, and/or a test read operation may be performed. If the address ADD is "00 . . . 01", the comparison result signal "com" may be enabled so that the error classification and storage portions ECS1 and ECS2 enable the address non-identity signal ADNH to indicate that the address "00 . . . 01" is not identical to an address stored in the address register 26-11. The defective address input controller 26-4 may enable the address input control signal ADIN in response to the address non-identity signal ADNH. The error classification and storage portion selector 26-5 may generate selection signals SEL1 to SEL3 corresponding to "100" in response to the address non-identity signal ADNH. The switch controller 26-9 of the error classification and storage portion selector 26-5 may enable the switching control signal "scon". Accordingly, the second switch 26-3 of the error classification and storage portion selector 26-5 may store the latched address LADD in the defective address register 26-11 through the third switch 26-10 of the error classification and storage portion ECS1 in response to the address input control signal ADIN.

During the test read operation, if the address ADD is "00 . . . 01" and the comparison result signal "com" is enabled 3 times, the counter 26-8 may count "10" and enable the counting output signal "cout". The fourth switch 26-12 may output the address "00 . . . 01" as the defective address FADD1 in response to the counting output signal "cout".

After the test read operation is carried out, an address corresponding to a second comparison result signal "com" may be "11 . . . 11", which may be stored in the error classification and storage portion ECS2. However, an address "10 . . . 00" corresponding to a fourth comparison result signal "com" may not be stored in the error classification and storage portions ECS1 and ECS2 in response to the selection signals SEL1 to SEL3 output from the error classification and storage portion selector 26-5. Because an address "11 . . . 11" stored in the error classification and storage portion ECS2 is input only twice in response to the comparison result signal "com", the address "11 . . . 11" may not be output as the defective address FADD2.

As described above, the semiconductor memory device according to an example embodiment may determine whether an address is to be programmed as a defective address or not depending on the number of times an error occurs. In other words, if the number of times the error occurs is less than a desired, or alternatively, a predetermined number, the error detection and correction unit 16 of the semiconductor memory device may determine the error as a correctible error and does not program the corresponding address as a defective address.

Figure 16:
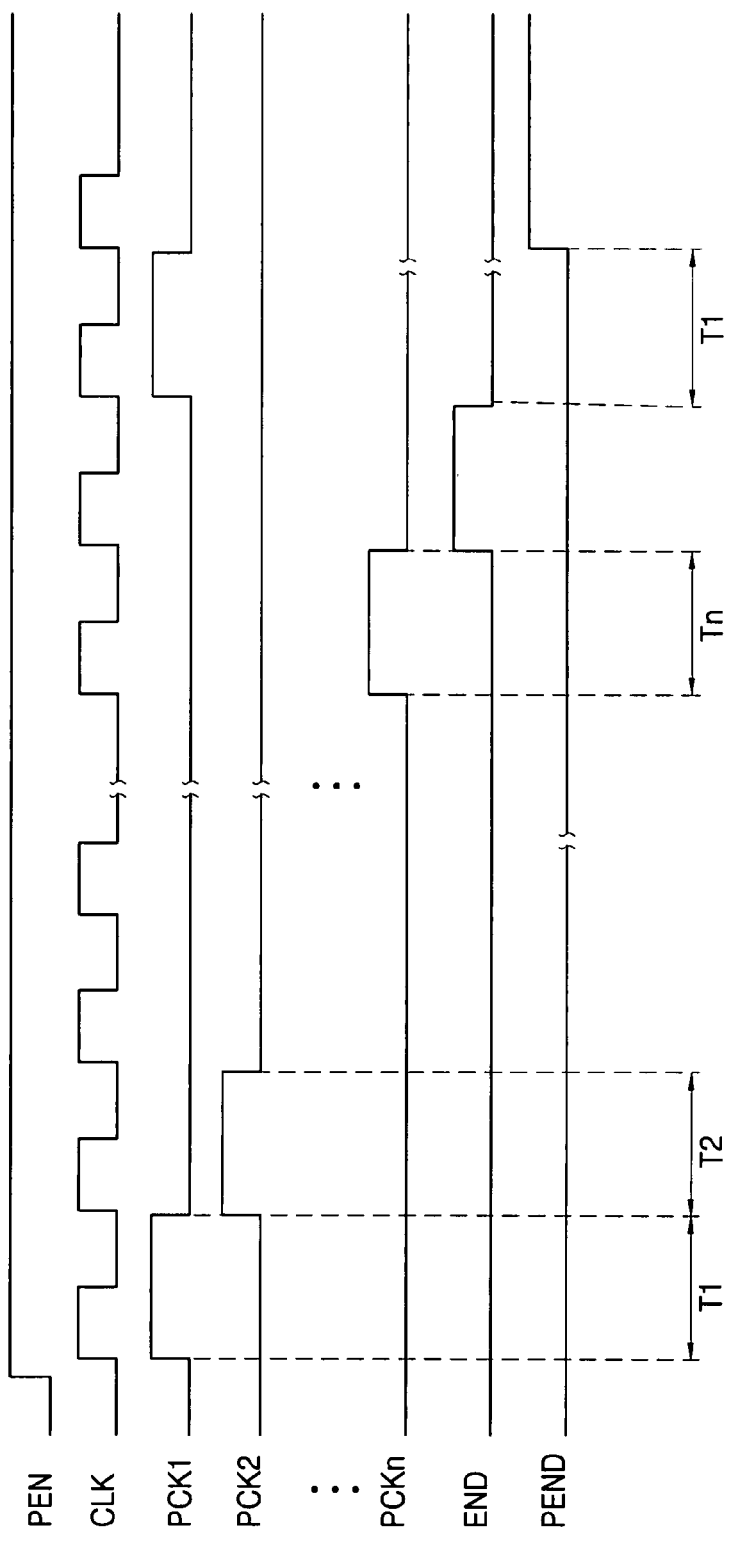
FIG. 16 is an example timing diagram illustrating a program operation of a semiconductor memory device according to an example embodiment.

FIG. 16 is an example timing diagram illustrating a program operation of a semiconductor memory device according to an example embodiment. The program operation may be conducted in a case where a defective address includes n bits and is programmed 1-bit by 1-bit in response to the program clock signals PCK1 to PCKn.

Referring to FIG. 6, the clock generator 28-1 may generate the clock signal "clk" if the program enable signal PEN is enabled. The shift register 28-2 may shift a high-level signal 1-bit by 1-bit in response to the clock signal "clk" and/or generate n program clock signals PCK1 to PCKn that may be enabled in sequence. If the shifting operation comes to an end, the shifting end signal END may be generated to reset the shift register 28-2. If the program end signal PEND is not enabled, the clock generator 28-1 may generate the clock signal "clk" and/or the shift register 28-2 may perform a shifting operation again in response to the clock signal "clk". On the other hand, if the program end signal PEND is enabled, the operation of the clock generator 28-1 may be disabled and/or the shift register 28-2 may be reset. A program operation may be performed on each bit of n-bit defective addresses during each of periods T1 to Tn. If a one-time program operation is not followed by generation of the program end signal PEND, it may be decided that the program operation is not properly conducted, so that a re-program operation may be performed.

Figure 17:
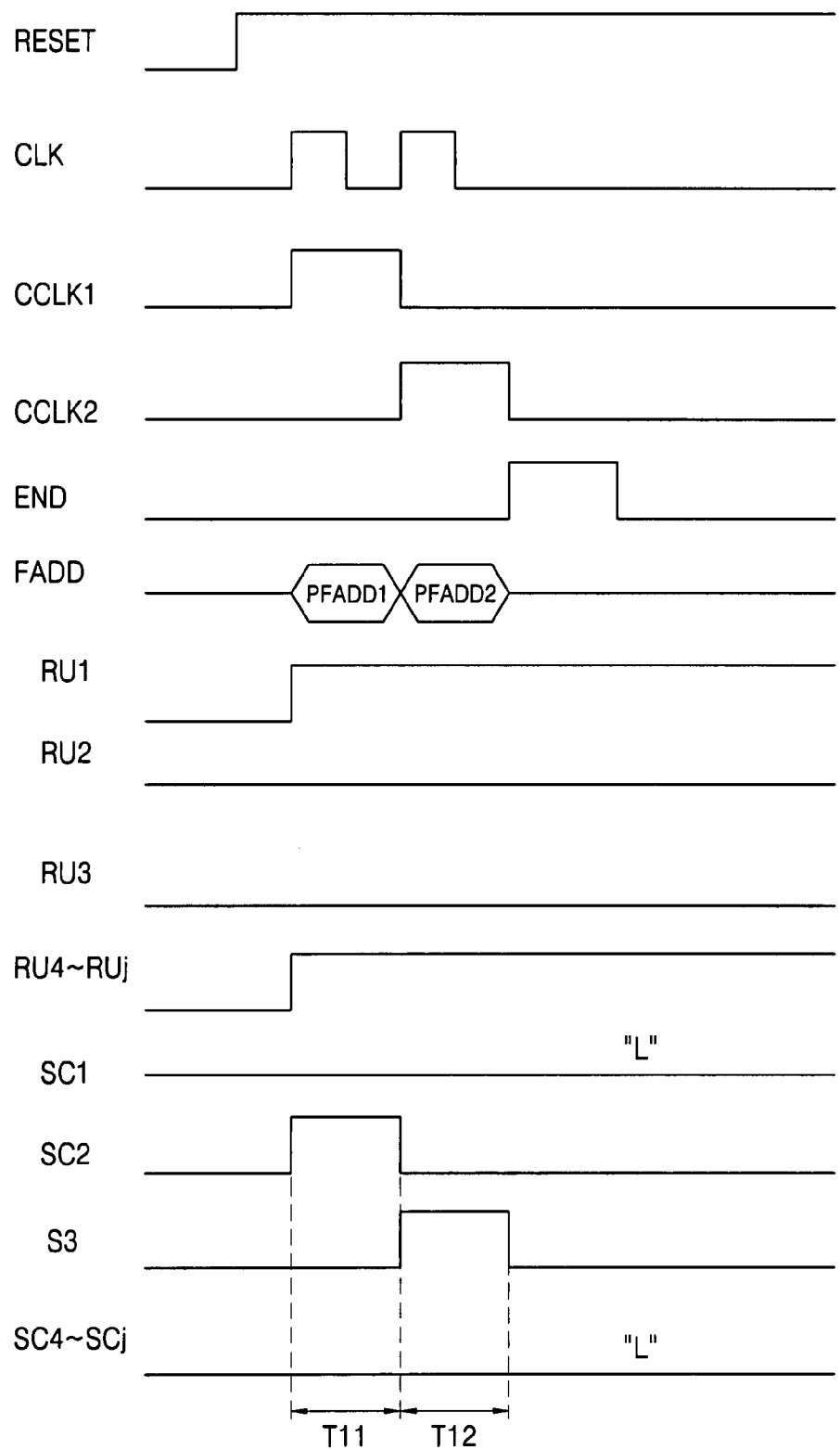
FIG. 17 is an example timing diagram illustrating a redundancy operation of a semiconductor memory device according to an example embodiment.

FIG. 17 is an example timing diagram illustrating a redundancy operation of a semiconductor memory device according to an example embodiment. The redundancy operation may be performed in a case where the semiconductor memory device includes two program units, each of which may be the same as described in FIG. 1, the shift register (36-2 in FIG. 9) may include 3 flip-flops, and defective addresses PFADD1 and PFADD2 may be programmed in each of the two program units.

Referring to FIG. 9, the shift register 36-2 may be reset in response to the reset signal RESET. The clock generator 36-1 may generate the clock signal CLK, and/or the shift register 36-2 and the logic AND circuit 36-3 may generate the two switching clock signals CCLK1 and CCLK2 and the shifting end signal END, which may be enabled in sequence, in response to the clock signal CLK. The clock generator 36-1 may terminate generation of the clock signal CLK in response to the shifting end signal END. Referring to FIG. 10, the programmed defective addresses PFADD1 and PFADD2 may be sequentially output as defective addresses fADD in response to the switching clock signals CCLK1 and CCLK2. Referring to FIG. 11, the redundancy signals RU1 and RUj may be generated in response to the reset signal RESET, and because the redundancy signals RU2 and RU3 may be disabled, the switching control signals SC2 and SC3 may be enabled. Referring to FIG. 12, the defective addresses fA1 and fA2 may be transmitted through the switches SW22 and SW23 in response to the switching control signals SC2 and SC3, respectively. Referring to FIG. 13, the defective addresses fA1 and fA2 may be stored in the address registers 12-212 of the redundancy decoders 12-22 and 12-23, respectively. If the same address as an address that is stored in the address registers in a normal operation is externally applied, a memory cell group of the corresponding address of the memory cell array may be replaced by a redundancy memory cell group.

The above-described semiconductor memory device may be constructed such that each of the redundancy decoders of a redundancy address decoder is capable of programming one of a defective address detected at a wafer level and a defective address detected at a package level. However, in another example embodiment, the semiconductor memory device may be constructed such that each of the redundancy decoders of the redundancy address decoder is capable of programming only the defective address detected at the package level.

The above-described semiconductor memory device may be constructed such that a memory cell group connected to one word line may be replaced by a redundancy memory cell group connected to one redundancy word line, or a memory cell group, which is connected to a bit line selected in response to a signal applied to one column selection signal line, may be replaced by a redundancy memory cell group, which is connected to a redundancy bit line selected in response to a signal applied to one redundancy column selection signal line. However, according to circumstances, the semiconductor memory device may be constructed such that memory cells, which are selected in response to signals applied to one word line and one column selection signal line, may be replaced by redundancy memory cells, which are selected in response to signals applied to one redundancy word line and one redundancy column selection signal line.

Further, the above-described semiconductor memory device may be constructed such that the high voltage HV is generated by a program control unit. However, the high voltage HV may be directly applied from an external test apparatus.

According to example embodiments as described above, a defective address detected as the result of a test at a package level may be internally stored and programmed. Accordingly, an external test apparatus need not store the defective address, and/or may only apply a program enable signal during a program operation. Accordingly, the burden of the test apparatus may be significantly reduced.

According to example embodiments, a semiconductor memory device according to example embodiments may be capable of transmitting a defective address, which is programmed at the package level, to an unused redundancy decoder.

Although example embodiments have been shown and described in this specification and figures, it would be appreciated by those skilled in the art that changes may be made to the illustrated and/or described example embodiments without departing from their principles and spirit.

What is claimed is:

1. A semiconductor memory device comprising:
a memory cell array including a plurality of memory cell groups and a predetermined number of redundancy memory cell groups;
a redundancy address decoder including a predetermined number of redundancy decoders for accessing at least one group of the redundancy memory cell groups when a first defective address is identical to an externally applied address;
a defective address detection unit for performing a write operation and a read operation on the memory cell array during a test operation to detect a defective address, and outputting the detected defective address as the first defective address when the same defective address is detected a predetermined number of times or more; and
a defective address program unit for receiving and programming the first defective address output from the defective address detection unit during a program operation.

2. The device according to claim 1, further comprising a redundancy control unit for receiving a predetermined number of redundancy signals output from the redundancy decoders, and outputting the programmed first defective address to an unused redundancy decoder of the redundancy decoders in response to the redundancy signals.

3. The device according to claim 2, wherein each of the redundancy decoders generates the redundancy signal when a second defective address is programmed at a wafer level, and accesses at least another group of the redundancy memory cell groups when the programmed second defective address is identical to an externally applied address.

4. The device according to claim 3, wherein the redundancy address decoder generates an enable signal when the address is identical to one of the first and second defective addresses, and
the redundancy address decoder is disabled in response to the enable signal.

5. The device according to claim 1, further comprising:
an address decoder for accessing at least one of the memory cell groups in response to an externally applied address; and
a mode setting unit for generating a test enable signal for the test operation and a program enable signal for the program operation in response to an externally applied signal during a mode setting operation.

6. The device according to claim 5, wherein the defective address detection unit comprises:
a data input and error code generation portion for receiving externally applied input data to generate an error code corresponding to the input data during the write operation, and outputting the input data and the error code to the memory cell array;
an error detection and correction portion for receiving read data from the memory cell array during the read operation, and detecting whether there is an error in data included in the read data to generate an error signal; and
a defective address generation portion being enabled in response to the test enable signal and for storing the address in response to the error signal, and outputting the address as the first defective address when the error signal is generated in the same address a predetermined number of times or more.

7. The device according to claim 6, wherein the defective address generation portion comprises:
a first switch for outputting the address in response to the error signal;
an address input controller for generating an address input control signal in response to an address non-identity signal;
a second switch for outputting the address in response to the address input control signal;
a selector for enabling one of a predetermined number of selection signals in response to the address input control signal; and
a predetermined number of error classification and storage portions, each comprising:
an address storage portion for storing a temporary defective address;
a comparison and signal generator for generating an address identity signal when an address transmitted from the first switch is identical to the temporary defective address, and generating the address non-identity signal when the address transmitted form the first switch is different from the temporary defective address;
a third switch for outputting the temporary defective address as the first defective address when the address identity signal is generated the predetermined number of times or more;
a switching controller for generating a switching control signal in response to the selection signal; and
a fourth switch for outputting an address output from the second switch as the temporary defective address in response to the switching control signal.

8. The device according to claim 7, wherein the error detection and correction portion comprises:
an error detector for generating an error code corresponding to the data included in the read data, and generating the error signal when the error code is different from an error code included in the read data; and
an error corrector for correcting the error of the data included in the read data in response to the error signal to generate output data.

9. The device according to claim 5, wherein the defective address program unit comprises:
a program control portion being enabled in response to the program enable signal to generate a program clock signal, and being disabled in response to a program end signal;
a predetermined number of program portions for programming the first defective address in response to the program clock signal and a high voltage; and a program end detection portion for generating the program end signal when the programmed first defective address is identical to the first defective address.

10. The device according to claim 9, wherein the program control portion comprises:
   a clock generator for generating a first clock signal in response to the program enable signal, and being disabled in response to the program end signal; and
   a program clock signal generator for generating a plurality of program clock signals which are enabled in sequence in response to the first clock signal, and being disabled in response to the program end signal.

11. The device according to claim 10, wherein the program clock signal generator comprises:
   a shift register including a plurality of flip-flops that are connected in series and shift a high-level signal in response to the first clock signal, and for generating a shifting end signal and resetting the flip-flops in response to one of the shifting end signal and the program end signal; and
   a combinational circuit for generating output signals of the flip-flops as the program clock signals in response to the shifting end signal.

12. The device according to claim 9, wherein each of the program portions comprises a plurality of program circuits, each having a fuse capable of being electrically cut, and when the high voltage is applied to the program portions, the program portions simultaneously program at least 1 bit of the first defective address, which is applied to each of the program portions, in response to each of the program clock signals.

13. The device according to claim 12, wherein each of the program circuits comprises:
   a logic AND gate for outputting 1 bit of the first defective address in response to the program clock signal;
   a first fuse having one side connected to a power supply voltage terminal;
   a second fuse having one side connected to the power supply voltage terminal;
   a first switching transistor having a drain connected to the other side of the first fuse, a gate to which an output signal of the logic AND gate is applied, and a source connected to a ground voltage;
   a first PMOS transistor having a source connected to the other side of the first fuse, a gate connected to a first node, and a drain connected to a second node;
   a second PMOS transistor having a source connected to the other side of the second fuse, a gate connected to the second node, and a drain connected to the first node;
   a first NMOS transistor having a drain connected to the drain of the first PMOS transistor, a gate connected to the second node, and a source connected to the ground voltage; and
   a second NMOS transistor having a drain connected to the first node, a gate connected to the second node, and a source connected to the ground voltage,
   wherein each of the program circuits outputs 1 bit of the programmed first defective address through the second node, and the high voltage is applied to the power supply voltage terminal during the program operation.

14. The device according to claim 2, wherein the redundancy control unit further comprises a switching portion for sequentially outputting the programmed first defective address in response to each of a predetermined number of switching clock signals.

15. The device according to claim 14, wherein the redundancy control unit further comprises a clock signal generation portion for generating a clock signal, and sequentially generating the switching clock signals in response to the clock signal.

16. The device according to claim 3, wherein the redundancy control unit comprises a predetermined number of redundancy control circuits that are cascade-connected, the predetermined number of redundancy control circuits comprising:
   a decoder for receiving a front-end redundancy signal and the corresponding redundancy signal to enable a first decoding signal when both the front-end redundancy signal and the corresponding redundancy signal indicate the use of redundancy, enable a second decoding signal when the front-end redundancy signal indicates the use of redundancy and the corresponding redundancy signal indicates the disuse of redundancy, enable a third decoding signal when the front-end redundancy signal indicates the disuse of redundancy and the corresponding redundancy signal indicates the use of redundancy, and enable a fourth decoding signal when both the front-end redundancy signal and the corresponding redundancy signal indicate the disuse of redundancy; and
   a switching control signal generation portion for generating the first decoding signal as a first output signal when a first output signal of the front-end redundancy control circuit is disabled, generating the second decoding signal as a second output signal when the first output signal of the front-end redundancy control circuit is enabled, generating the third decoding signal as the first output signal when a switching control signal of the front-end redundancy control circuit is disabled, generating the fourth decoding signal as the second output signal when the switching control signal of the front-end redundancy control circuit is enabled, and outputting the second output signal as the switching control signal in response to a clock signal.

17. The device according to claim 3, wherein the redundancy control unit comprises a predetermined number of redundancy control circuits that are cascade-connected, each of the redundancy control circuits comprising:
   a decoder for receiving a front-end redundancy signal and the corresponding redundancy signal to generate a first through fourth decoding signals;
   a first switch for generating the first decoding signal as a first output signal or generating the second decoding signal as a second output signal in response to a first output signal output from the front-end redundancy control circuit;
   a second switch for generating the third decoding signal as the first output signal or generating the fourth decoding signal as the second output signal in response to a switching control signal output from the front-end redundancy control circuit; and
   a first flip-flop for outputting the second output signal as the corresponding switching control signal in response to a clock signal.

18. The device according to claim 17, wherein a first redundancy control circuit of the redundancy control circuits that are cascade-connected comprises:
   a third switch for generating a power supply voltage as a first output signal or generating a second output signal in response to a first redundancy signal; and
   a second flip-flop for outputting the second output signal as a first switching control signal in response to the clock signal.

19. The device according to claim 16, wherein the redundancy control unit further comprises a predetermined number of fourth switches for transmitting the programmed first defective address in response to the switching control signals output from the redundancy control circuits.

20. The device according to claim 19, wherein each of the redundancy decoders is included in each of the redundancy memory cell groups, and comprises:
a redundancy signal generation portion including a first fuse and for generating the redundancy signal depending on the cutting of the first fuse when a reset signal is applied;
a first decoder including a plurality of second fuses, and for programming the second defective address depending on the cutting of the second fuses and generating a selection signal for selecting the corresponding redundancy memory cell group in response to the redundancy signal when the programmed second defective address is identical to the address;
a redundancy control signal generation portion for detecting the application of the first defective address from the corresponding one of the fourth switches to generate a redundancy control signal; and
a second decoder being enabled in response to the redundancy control signal, and for generating a selection signal for selecting the corresponding redundancy memory cell group when the programmed first defective address is identical to the address.

21. The device according to claim 20, wherein the reset signal is a signal that transitions from a low level to a high level during an initialization operation and transitions from a high level to a low level in a predetermined amount of time, and
the redundancy signal generation portion comprises:
a first PMOS transistor having a source to which a power supply voltage is applied and a gate to which the reset signal is applied;
a first NMOS transistor having a source to which a ground voltage is applied, a gate to which the reset signal is applied, and a drain connected to a first node;
a first inverter for inverting a signal at the first node to output the redundancy signal to a second node; and
a second NMOS transistor having a source to which the ground voltage is applied, a gate to which the redundancy signal is applied, and a drain connected to the first node, the first fuse being connected between a drain of the first PMOS transistor and the drain of the first NMOS transistor.

22. The device according to claim 20, wherein the first decoder comprises a plurality of fuse program circuits, which comprise the second fuses, respectively, and
each of the fuse program circuits comprises:
a first NMOS transistor having a gate to which the redundancy signal is applied and a drain (or a source) to which 1 bit corresponding to the address is applied;
the second fuse having one side connected to the source (or the drain) of the first NMOS transistor; and
a second NMOS transistor having a gate to which an inverted signal of the redundancy signal is applied, a drain connected to the other side of the second fuse, and a source to which the ground voltage is applied, an output signal being output through the drain of the second NMOS transistor.

23. The device according to claim 20, wherein the redundancy control signal generation portion comprises a logic OR gate for performing a logic OR operation on a 1-bit signal of the programmed first defective address output from the corresponding fourth switch among the fourth switches and an inverted signal of the 1-bit signal to generate the redundancy control signal.

24. The device according to claim 23, wherein the second decoder comprises circuits corresponding to the respective bits of the address, and
each of the circuits of the second decoder comprises:
a first NMOS transistor having a drain (or a source) to which the corresponding bit of the address is applied and a gate to which the redundancy control signal is applied;
a second NMOS transistor having a drain connected to the source (or the drain) of the first NMOS transistor and a gate to which the corresponding bit of the first defective address is applied; and
a third NMOS transistor having a drain connected to a source of the second NMOS transistor, a gate to which an inverted signal of the redundancy control signal is applied, and a source to which a ground voltage is applied, an output signal being output through the drain of the third NMOS transistor.

25. A semiconductor memory device comprising:
a memory cell array including a plurality of memory cell groups and a predetermined number of redundancy memory cell groups;
a redundancy address decoder for generating a redundancy signal when a first defective address is programmed at a wafer level, accessing at least one group of the redundancy memory cell groups when the programmed first defective address is identical to an externally applied address, and accessing at least another group of the redundancy memory cell groups when a second defective address detected at a package level is identical to the address;
a defective address detection unit for performing a write operation and a read operation on the memory cell array to detect the second defective address, and outputting the detected second defective address during a test operation at the package level;
a defective address program unit for receiving the second defective address output from the defective address detection unit, and programming the second defective address during a program operation at the package level; and
a redundancy control unit for outputting the programmed second defective address to an unused redundancy decoder of the redundancy decoders in response to a predetermined number of redundancy signals.

26. The device according to claim 25, further comprising a mode setting unit for generating a test enable signal for the test operation and a program enable signal for the program operation in response to an externally applied signal during a mode setting operation.

27. The device according to claim 26, wherein the defective address detection unit comprises:
a data input and error code generation portion for receiving externally applied input data to generate an error code corresponding to the input data during the write operation, and outputting the input data and the error code to the memory cell array;
an error detection and correction portion for receiving read data from the memory cell array during the read operation, and detecting whether there is an error in data included in the read data to generate an error signal; and
a defective address generation portion being enabled in response to the test enable signal and for storing the address in response to the error signal, and outputting the address as the second defective address when the error signal is generated in the same address a predetermined number of times or more.

28. The device according to claim 27, wherein the defective address generation portion comprises:
   a first switch for outputting the address in response to the error signal;
   an address input controller for generating an address input control signal in response to an address non-identity signal;
   a second switch for outputting the address in response to the address input control signal;
   a selector for enabling one of a predetermined number of selection signals in response to the address input control signal; and
   a predetermined number of error classification and storage portions, each comprising:
      an address storage portion for storing a temporary defective address;
      a comparison and signal generator for generating an address identity signal when an address transmitted from the first switch is identical to the temporary defective address, and generating the address non-identity signal when the address transmitted form the first switch is different from the temporary defective address;
      a third switch for outputting the temporary defective address as the second defective address when the address identity signal is generated the predetermined number of times or more;
      a switching controller for generating a switching control signal in response to the selection signal; and
      a fourth switch for outputting an address output from the second switch as the temporary defective address in response to the switching control signal.

29. The device according to claim 28, wherein the error detection and correction portion comprises:
   an error detector for generating an error code corresponding to the data included in the read data, and generating the error signal when the error code is different from an error code included in the read data; and
   an error corrector for correcting the error of the data included in the read data in response to the error signal to generate output data.

30. The device according to claim 26, wherein the defective address program unit comprises:
   a program control portion being enabled in response to the program enable signal to apply a high voltage and generate a program clock signal, and being disabled in response to a program end signal;
   a predetermined number of program portions for programming the second defective address in response to the program clock signal and the high voltage; and
   a program end detection portion for generating the program end signal when the programmed defective address is identical to the defective address.

31. The device according to claim 30, wherein the program control portion comprises:
   a clock generator for generating a first clock signal in response to the program enable signal, and being disabled in response to the program end signal; and
   a program clock signal generator for generating a plurality of program clock signals, which are enabled in sequence, in response to the first clock signal, and being disabled in response to the program end signal.

32. The device according to claim 31, wherein the program clock signal generator comprises:
   a shift register including a plurality of flip-flops that are connected in series and shift a high-level signal in response to the first clock signal, and for generating a shifting end signal and resetting the flip-flops in response to one of the shifting end signal and the program end signal; and
   a combinational circuit for generating output signals of the flip-flops as the program clock signals in response to the shifting end signal.

33. The device according to claim 30, wherein each of the program portions comprises a plurality of program circuits, each having a fuse capable of being electrically cut, and when the high voltage is applied to the program portions, the program portions simultaneously program at least 1 bit of the second defective address, which is applied to each of the program portions, in response to each of the program clock signals.

34. The device according to claim 25, wherein the redundancy control unit further comprises a switching portion for sequentially outputting the programmed second defective address in response to each of a predetermined number of switching clock signals.

35. The device according to claim 34, wherein the redundancy control unit further comprises a clock signal generation portion for generating a clock signal, and sequentially generating the switching clock signals in response to the clock signal.

36. The device according to claim 25, wherein the redundancy control unit comprises a predetermined number of redundancy control circuits that are cascade-connected, the predetermined number of redundancy control circuits comprising:
   a decoder for receiving a front-end redundancy signal and the corresponding redundancy signal to enable a first decoding signal when both the front-end redundancy signal and the corresponding redundancy signal indicate the use of redundancy, enable a second decoding signal when the front-end redundancy signal indicates the use of redundancy and the corresponding redundancy signal indicates the disuse of redundancy, enable a third decoding signal when the front-end redundancy signal indicates the disuse of redundancy and the corresponding redundancy signal indicates the use of redundancy, and enable a fourth decoding signal when both the front-end redundancy signal and the corresponding redundancy signal indicate the disuse of redundancy; and
   a switching control signal generation portion for generating the first decoding signal as a first output signal when a first output signal of the front-end redundancy control circuit is disabled, generating the second decoding signal as a second output signal when the first output signal of the front-end redundancy control circuit is enabled, generating the third decoding signal as the first output signal when a switching control signal of the front-end redundancy control circuit is disabled, generating the fourth decoding signal as the second output signal when the switching control signal of the front-end redundancy control circuit is enabled, and outputting the second output signal as the switching control signal in response to a clock signal.

37. The device according to claim 25, wherein the redundancy control unit comprises a predetermined number of redundancy control circuits that are cascade-connected, each of the redundancy control circuits comprising:
   a decoder for receiving a front-end redundancy signal and the corresponding redundancy signal to generate a first through fourth decoding signals;

a first switch for generating the first decoding signal as a first output signal or generating the second decoding signal as a second output signal in response to a first output signal output from the front-end redundancy control circuit;
a second switch for generating the third decoding signal as the first output signal or generating the fourth decoding signal as the second output signal in response to a switching control signal output from the front-end redundancy control circuit; and
a first flip-flop for outputting the second output signal as the corresponding switching control signal in response to a clock signal.

38. The device according to claim 37, wherein a first redundancy control circuit of the redundancy control circuits that are cascade-connected comprises:
a third switch for generating a power supply voltage as a first output signal or generating a second output signal in response to a first redundancy signal; and
a second flip-flop for outputting the second output signal as a first switching control signal in response to the clock signal.

39. A redundancy method of a semiconductor memory device comprising a memory cell array including a plurality of memory cell groups and a predetermined number of redundancy memory cell groups, the method comprising:
performing a write operation and a read operation on the memory cell array during a test operation to detect a defective address, and outputting the detected defective address when the same defective address is detected a predetermined number of times or more;
receiving and programming the detected defective address during a program operation to generate the programmed defective address; and
accessing the redundancy memory cell group in a normal operation when the programmed defective address is identical to an externally applied address.

40. The method according to claim 39, wherein detecting the defective address comprises:
receiving externally applied input data and generating an error code corresponding to the input data during the write operation, and outputting the input data and the error code to the memory cell array;
receiving read data from the memory cell array during the read operation and detecting whether there is an error in data included in the read data to generate an error signal; and
storing the address in response to the error signal, and outputting the address as the defective address when the error signal is generated in the same address a predetermined number of times or more.

41. The method according to claim 39, wherein programming the defective address comprises:
programming at least 1 bit of the defective address; and
ending the programming of the defective address when the programmed defective address is identical to the detected defective address, and re-programming the defective address when the programmed defective address is different from the detected defective address.

42. The method according to claim 39, wherein the semiconductor memory device further comprises a predetermined number of redundancy decoders for accessing the redundancy memory cell groups, and accessing the redundancy memory cell group comprises outputting the programmed defective address to an unused redundancy decoder of the redundancy decoders in response to a predetermined number of redundancy signals output from the redundancy decoders.

43. The method according to claim 42, wherein the semiconductor memory device further comprises a predetermined number of redundancy control circuits that are cascade-connected, and outputting the programmed defective address to the unused redundancy decoder comprises:
receiving an adjacent redundancy signal and the corresponding redundancy signal to enable a first decoding signal when both the adjacent redundancy signal and the corresponding redundancy signal indicate the use of redundancy, enable a second decoding signal when the adjacent redundancy signal indicates the use of redundancy and the corresponding redundancy signal indicates the disuse of redundancy, enable a third decoding signal when the adjacent redundancy signal indicates the disuse of redundancy and the corresponding redundancy signal indicates the use of redundancy, and enable a fourth decoding signal when both the adjacent redundancy signal and the corresponding redundancy signal indicate the disuse of redundancy; and
generating the first decoding signal as a first output signal when a first output signal of a front-end redundancy control circuit is disabled, generating the second decoding signal as a second output signal when the first output signal of the front-end redundancy control circuit is enabled, generating the third decoding signal as the first output signal when a switching control signal of the front-end redundancy control circuit is disabled, generating the fourth decoding signal as the second output signal when the switching control signal of the front-end redundancy control circuit is enabled, and outputting the second output signal as the switching control signal in response to a clock signal.

* * * * *